(12) United States Patent
Miyamoto et al.

(10) Patent No.: US 12,339,299 B2
(45) Date of Patent: Jun. 24, 2025

(54) CURRENT SENSOR

(71) Applicant: DENSO CORPORATION, Kariya (JP)

(72) Inventors: Ryo Miyamoto, Kariya (JP); Kazuki Mikamo, Kariya (JP); Takeshi Tsukamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 128 days.

(21) Appl. No.: 18/317,330

(22) Filed: May 15, 2023

(65) Prior Publication Data

US 2023/0280377 A1 Sep. 7, 2023

Related U.S. Application Data

(63) Continuation of application No. PCT/JP2021/044072, filed on Dec. 1, 2021.

(30) Foreign Application Priority Data

Dec. 2, 2020 (JP) ................. 2020-200304

(51) Int. Cl.
*G01R 15/20* (2006.01)
*G01R 19/00* (2006.01)

(52) U.S. Cl.
CPC ......... *G01R 15/20* (2013.01); *G01R 19/0092* (2013.01)

(58) Field of Classification Search
CPC ............... G01R 15/202; G01R 15/207; G01R 19/0092; G01R 1/18
See application file for complete search history.

(56) References Cited

U.S. PATENT DOCUMENTS

| 9,714,959 | B2 * | 7/2017 | Kawanami | G01R 15/20 |
| 10,281,497 | B2 * | 5/2019 | Shimizu | G01R 33/09 |
| 2004/0201038 | A1 | 10/2004 | Kimura et al. | |
| 2006/0082357 | A1 * | 4/2006 | Tsukamoto | G01R 15/20 |
| | | | | 324/126 |
| 2007/0026552 | A1 | 2/2007 | Kimura et al. | |
| 2015/0123650 | A1 | 5/2015 | Matsue et al. | |
| 2017/0343584 | A1 | 11/2017 | Abe | |
| 2017/0370969 | A1 * | 12/2017 | Okuyama | G01R 15/205 |

(Continued)

FOREIGN PATENT DOCUMENTS

| JP | 2005-070037 A | 3/2005 |
| JP | 2010-122239 A | 6/2010 |

(Continued)

*Primary Examiner* — Dominic E Hawkins
(74) *Attorney, Agent, or Firm* — Posz Law Group, PLC

(57) ABSTRACT

A current sensor includes: a bus bar defining a longitudinal direction along one direction and in which an alternating current flows along the longitudinal direction; a sensor unit that outputs a detection signal based on a magnetic field generated according to the alternating current flowing through the bus bar; and a sensor housing in which the bus bar and the sensor unit are arranged. The bus bar is configured by a first bus bar and a second bus bar stacked in an arrangement direction of the bus bar and the sensor unit. The bus bar includes a covered portion covered with the sensor housing and a fastening portion exposed from the sensor housing. The first bus bar and the second bus bar are arranged in a state in which a gap is defined between the first bus bar and the second bus bar in the covered portion.

13 Claims, 15 Drawing Sheets

(56) References Cited

U.S. PATENT DOCUMENTS

| | | | |
|---|---|---|---|
| 2018/0052191 A1* | 2/2018 | Kern | G01R 15/181 |
| 2019/0187187 A1* | 6/2019 | Umetsu | G01R 1/04 |
| 2019/0293733 A1 | 9/2019 | Esaka et al. | |

FOREIGN PATENT DOCUMENTS

| | | | |
|---|---|---|---|
| JP | 2014-055790 A | 3/2014 | |
| JP | 2017-133943 A | 8/2017 | |
| WO | 2014/123007 A1 | 8/2014 | |
| WO | WO-2016148022 A1 * | 9/2016 | G01R 15/148 |

* cited by examiner

CURRENT SENSOR

CROSS REFERENCE TO RELATED APPLICATIONS

The present application is a continuation application of International Patent Application No. PCT/JP2021/044072 filed on Dec. 1, 2021, which designated the U.S. and claims the benefit of priority from Japanese Patent Application No. 2020-200304 filed on Dec. 2, 2020. The entire disclosures of all of the above applications are incorporated herein by reference.

TECHNICAL FIELD

The present disclosure relates to a current sensor that detects an alternating current flowing through a bus bar.

BACKGROUND

For example, a current sensor that detects a current flowing through a bus bar has been proposed. In the proposed current sensor, for example, the bus bar and a sensor unit that outputs a detection signal corresponding to a magnetic field are disposed in the sensor housing.

SUMMARY

The present disclosure described a current sensor. According to an aspect of the present disclosure, a current sensor includes: a bus bar defining a longitudinal direction along one direction and in which an alternating current flows along the longitudinal direction; a sensor unit that outputs a detection signal based on a magnetic field generated according to the alternating current flowing through the bus bar; and a sensor housing in which the bus bar and the sensor unit are arranged. The bus bar is configured by a first bus bar and a second bus bar that are stacked in an arrangement direction of the bus bar and the sensor unit. The bus bar includes a covered portion covered with the sensor housing and a fastening portion exposed from the sensor housing. Further, the first bus bar and the second bus bar are arranged in a state in which a gap is defined between the first bus bar and the second bus bar in the covered portion.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
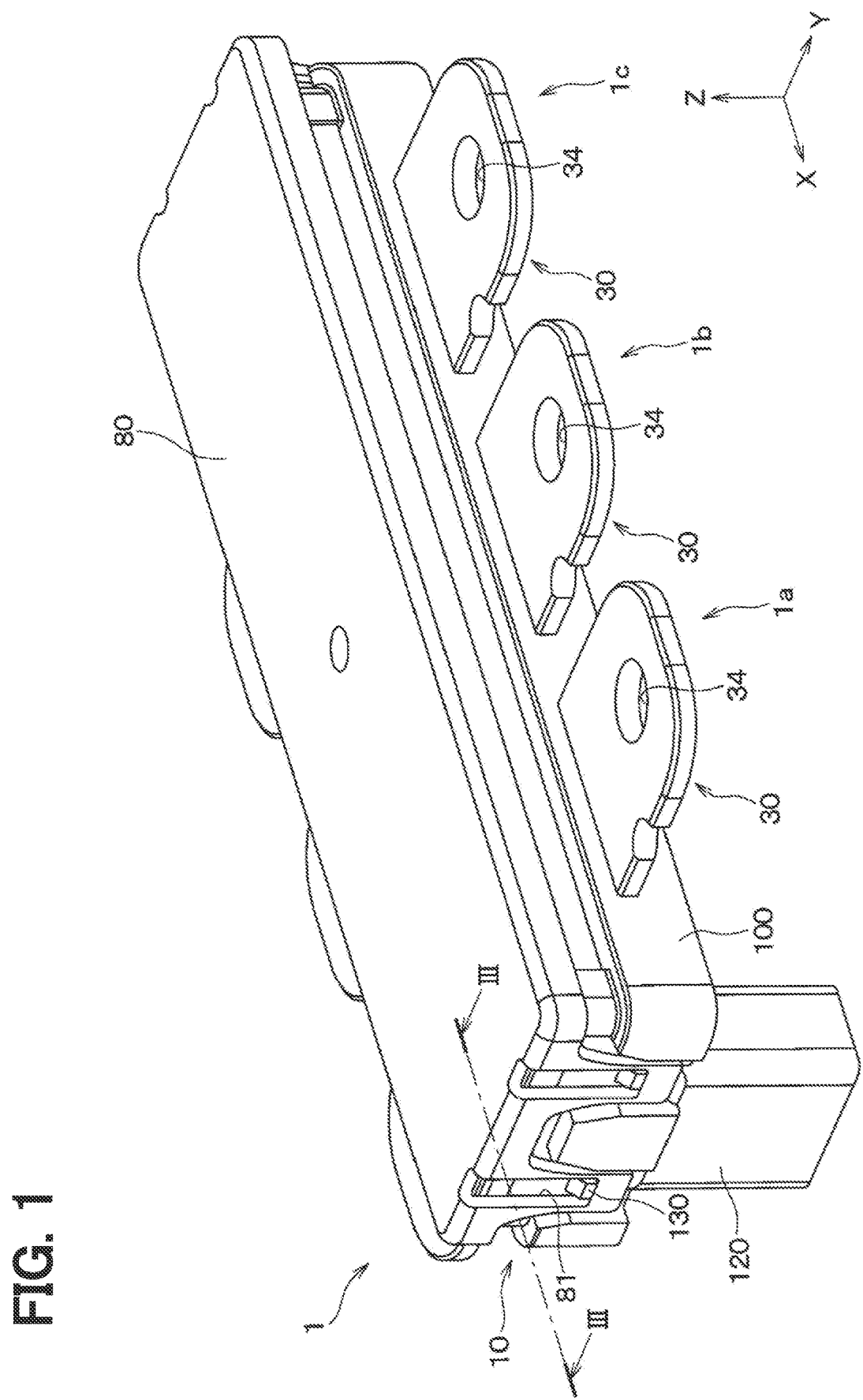
FIG. 1 is a diagram illustrating a perspective view of a current sensor according to a first embodiment.

To begin with, a relevant technology will be described only for understanding the embodiments of the present disclosure.

For example, a current sensor that detects a current flowing through a bus bar has been proposed. In the proposed current sensor, for example, the bus bar through which the current flows is disposed in a sensor housing. Also, a sensor unit that outputs a detection signal corresponding to a magnetic field is disposed in the sensor housing. The bus bar and the sensor unit are arranged to face each other. The bus bar has a flat plate shape with a longitudinal direction along a current flow direction, and has a rectangular shape in cross-section defined to have a normal direction along the current flow direction.

In such a current sensor, when the current flows through the bus bar, a signal magnetic field is generated around the bus bar. The sensor unit outputs a detection signal corresponding to the signal magnetic field. In this case, when an alternating current is caused to flow through the bus bar, the alternating current is likely to concentrate on an end portion in the cross section having the normal direction along the current flow direction due to a skin effect. In the current sensor in which the alternating current is caused to flow through the bus bar, for example, the sensor unit may be arranged at a position separated by a predetermined distance in a width direction from a portion facing the center of the bus bar in a width direction, the width direction being a direction intersecting the longitudinal direction of the bus bar and an arrangement direction of the bus bar and the sensor unit. Here, the phrase that the sensor unit may be arranged at the position separated by the predetermined distance includes a case in which the sensor unit is disposed at a position facing the center of the bus bar in the width direction (that is, the case where the predetermined distance is zero).

In such a current sensor in when the alternating current is caused to flow through the bus bar, however, a change in current density in the width direction of the bus bar is likely to be large. As such, the detection accuracy is likely to easily change due to an assembly error or the like between the sensor unit and the bus bar.

The present disclosure provides a current sensor capable of suppressing a change in detection accuracy.

According to an aspect of the present disclosure, a current sensor includes: a bus bar defining a longitudinal direction along one direction and in which an alternating current flows along the longitudinal direction; a sensor unit that outputs a detection signal based on a magnetic field generated according to the alternating current flowing through the bus bar; and a sensor housing in which the bus bar and the sensor unit are arranged. In the current sensor, the bus bar is configured by a first bus bar and a second bus bar that are stacked in an arrangement direction of the bus bar and the sensor unit. The bus bar includes a covered portion covered with the sensor housing and a fastening portion exposed from the sensor housing. Further, the first bus bar and the second bus bar are arranged in a state in which a gap is defined between the first bus bar and the second bus bar in the covered portion.

In such a configuration, it is possible to reduce a change in the current density in the bus bar in a width direction intersecting the longitudinal direction of the bus bar and the arrangement direction of the bus bar and the sensor unit. Therefore, even if the position of the sensor unit is deviated in the width direction when the sensor unit is arranged at a target position separated by a predetermined distance from a portion facing the center of the bus bar, a change in detection accuracy can be reduced. That is, it is possible to improve the robustness with respect to a positional deviation of the sensor unit in the width direction.

Embodiments of the present disclosure will be hereinafter described with reference to the drawings. In the following description, the same or equivalent parts are denoted by the same reference numerals throughout the embodiments.

First Embodiment

A current sensor according to a first embodiment will be described with reference to the drawings. The current sensor of the present embodiment is, for example, mounted on a vehicle and preferably used to detect an alternating current flowing through an inverter that drives a three-phase motor.

As shown in FIG. 1, a current sensor 1 of the present embodiment includes a first current sensor 1a, a second current sensor 1b, and a third current sensor 1c, which are integrated. Each of the first current sensor 1a, the second current sensor 1b, and the third current sensor 1c is a magnetic balance type coreless current sensor that does not require a core for collecting a magnetic field. Hereinafter, the configuration of the first current sensor 1a will be described. The second current sensor 1b and the third current sensor 1c have the similar configuration to those of the first current sensor 1a except for portions relating to a connection terminal 20 and a connector portion 120, which will be described later.

Figure 2:
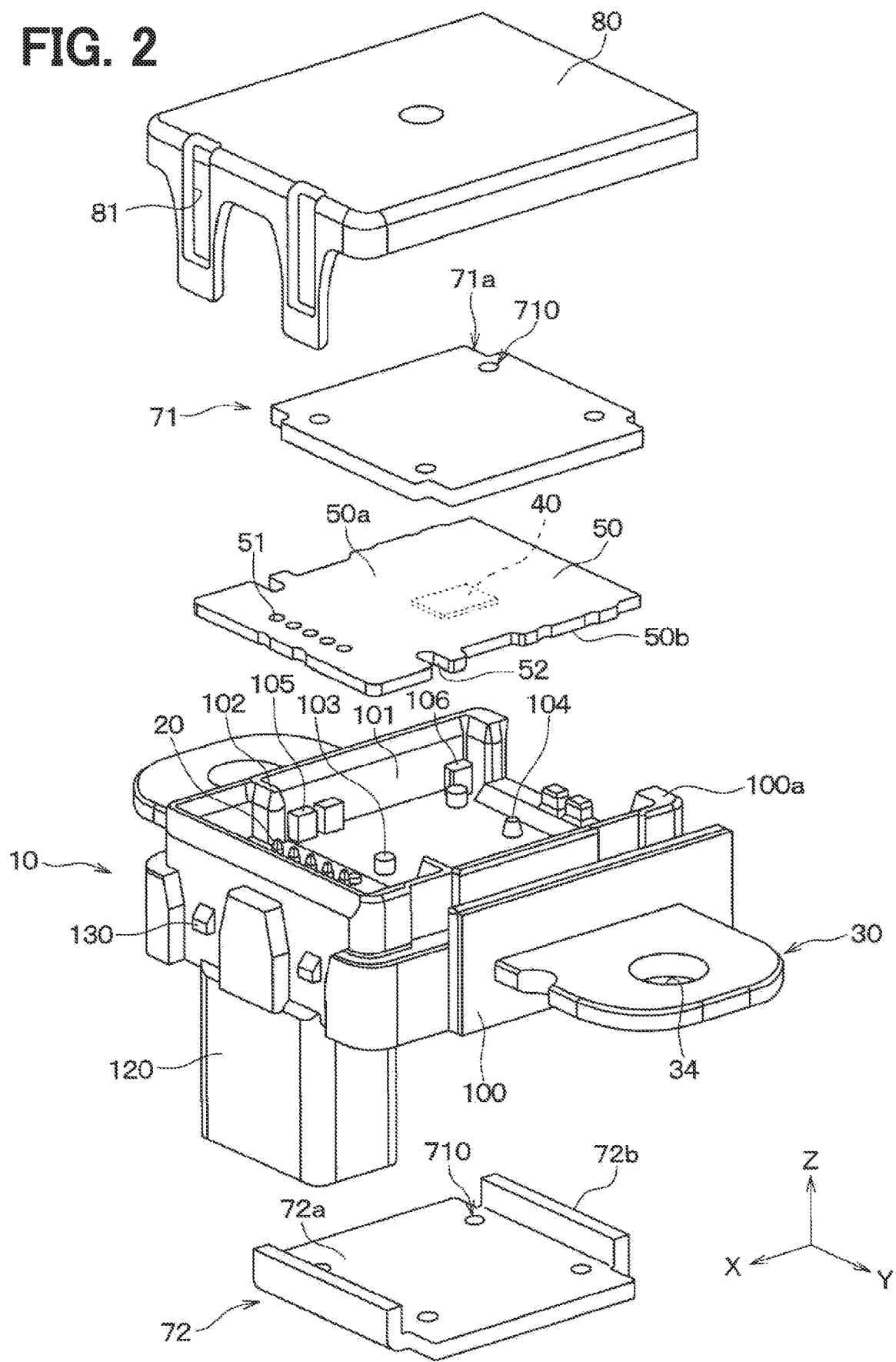
FIG. 2 is a diagram illustrating a perspective view of a first current sensor.
Figure 3:
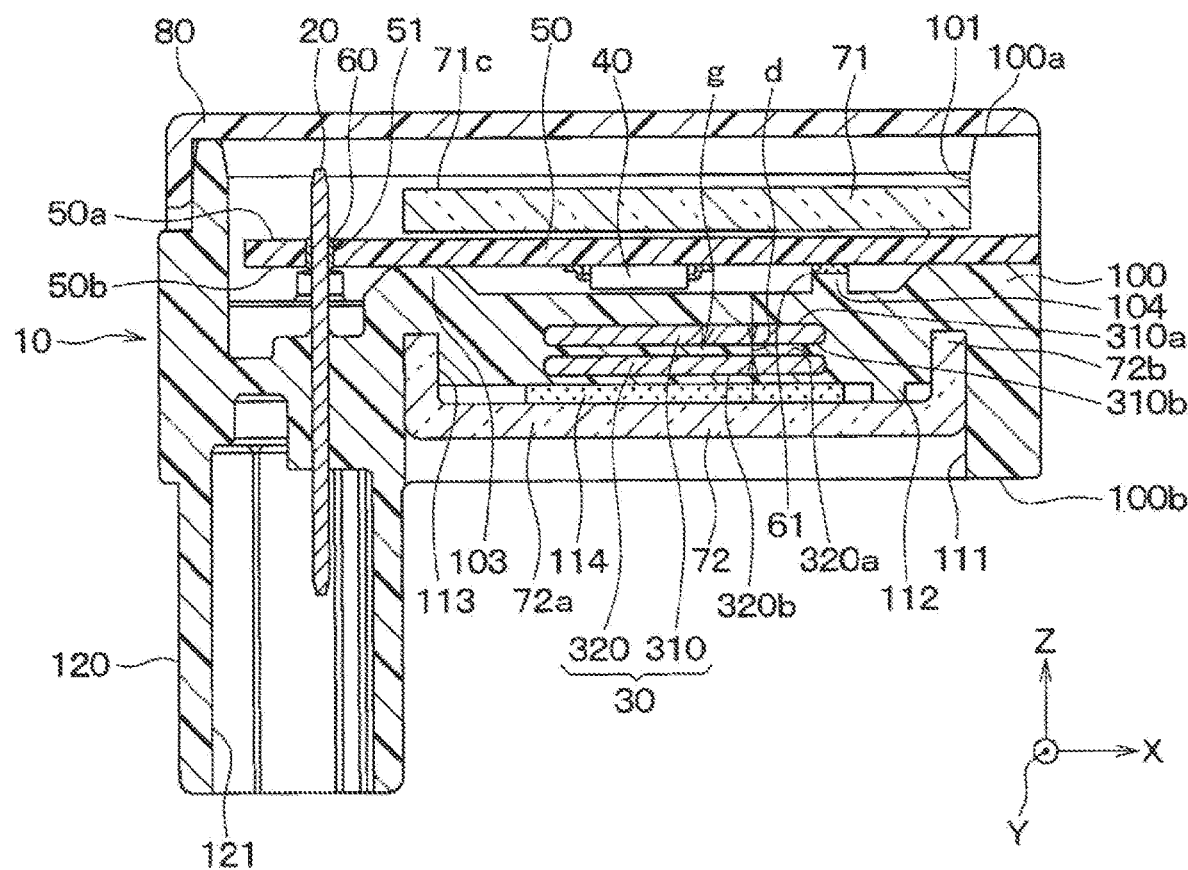
FIG. 3 is a diagram illustrating a cross-sectional view taken along a line III-Ill in FIG. 1.

As shown in FIGS. 2 and 3, the first current sensor 1a includes a sensor housing 10, the connection terminal 20, a bus bar 30, a sensor unit 40, a wiring substrate 50, a first shield portion 71, a second shield portion 72, a lid portion 80, and the like. In FIG. 2, illustration of the lid portion 80 is omitted. In FIG. 2, the bus bar 30 is illustrated in a simplified manner.

The sensor housing 10 is made of an insulating resin material, and includes a rectangular parallelepiped base portion 100 having one surface 100a and the other surface 100b, and the connector portion 120 provided at the base portion 100. In the following description, a direction along a planar direction of the one surface 100a of the base portion 100 is referred to as an X-axis direction, and a direction orthogonal to the X-axis direction and along the planar direction of the base portion 100 is referred to as a Y-axis direction. Also, a direction orthogonal to the X-axis direction and the Y-axis direction are referred to as a Z-axis direction. In the present embodiment, the connector portion 120 extends along the Z-axis direction at one end portion of the base portion 100 in the X-axis direction. The first current sensor 1a shares the sensor housing 10 with the second current sensor 1b and the third current sensor 1c.

The base portion 100 is formed with a first accommodation recess 101 on the one surface 100a side, and a second accommodation recess 111 on the other surface 100b side. In the first accommodation recess 101, a guide projection portion 102 corresponding to a guide recess portion 52 formed in the wiring substrate 50, which will be described later, a substrate support portion 103 that supports the wiring substrate 50, and a substrate bonding portion 104 that is bonded to the wiring substrate 50 are formed. In addition, in the first accommodation recess 101, a shield support portion 105 that supports the first shield portion 71, which will be described later, and a shield bonding portion 106 that is bonded to the first shield portion 71 are formed.

As shown in FIG. 2, the substrate support portion 103 and the substrate bonding portion 104 are disposed in the inner area on the bottom surface of the first accommodation recess 101. The shield support portion 105 and the shield bonding portion 106 are disposed adjacent to an outer edge on the bottom surface of the first accommodation recess 101 than the positions where the substrate support portion 103 and the substrate bonding portion 104 are disposed. More specifically, the shield support portion 105 and the shield bonding portion 106 are formed at positions protruding from the outer side of the wiring substrate 50 when the wiring substrate 50 is placed in the first accommodation recess 101.

The substrate support portion 103 has a height slightly larger than a height of the substrate bonding portion 104. The shield support portion 105 and the shield bonding portion 106 have heights larger than heights of the substrate support portion 103 and the substrate bonding portion 104. The height of the substrate support portion 103 is slightly larger than the height of the substrate bonding portion 104.

As shown in FIG. 3, the second accommodation recess 111 is formed with a shield support portion 112 that supports the second shield portion 72, which will be described later. The second accommodation recess 111 provides a portion in which the second shield portion 72 described later is disposed, and has a shape corresponding to the structure of the second shield portion 72. In the present embodiment, since the second shield portion 72 has a structure including wall portions 72b as will be described later, the second accommodation recess 111 is formed with groove portions 113 along the Z-axis direction, at both end portions in the X-axis direction.

The connector portion 120 has an opening 121 formed in a portion opposite to the first accommodation recess 101. In addition, as shown in FIGS. 1 and 2, the sensor housing 10 has coupling protrusions 130 on the outer surface thereof to correspond to coupling recesses 81 formed in the lid portion 80 as will be described later.

The connection terminal 20 is formed of a metal rod-shaped member, and a plurality of the connection terminals 20 are insert-molded and fixed to the sensor housing 10. Specifically, as shown in FIG. 3, each of the connection terminals 20 is insert-molded and fixed to the sensor housing 10 in such a manner that one end portion thereof is exposed from the first accommodation recess 101 and the other end portion thereof is exposed from the opening 121 of the connector portion 120. The other end portion of the connection terminal 20 is connected to a wire harness or the like to be connected to an external circuit.

The bus bar 30 is formed by press molding or the like of a conductor member, and is configured to have a longitudinal direction in one direction. The bus bar 30 is insert-molded in the sensor housing 10 in such a manner that a middle portion in the longitudinal direction is positioned between the first accommodation recess 101 and the second accommodation recess 111 and both end portions are exposed from the sensor housing 10. The bus bar 30 of the present embodiment is fixed to the sensor housing 10 in such a manner that the longitudinal direction thereof is along the Y-axis direction.

Figure 4:
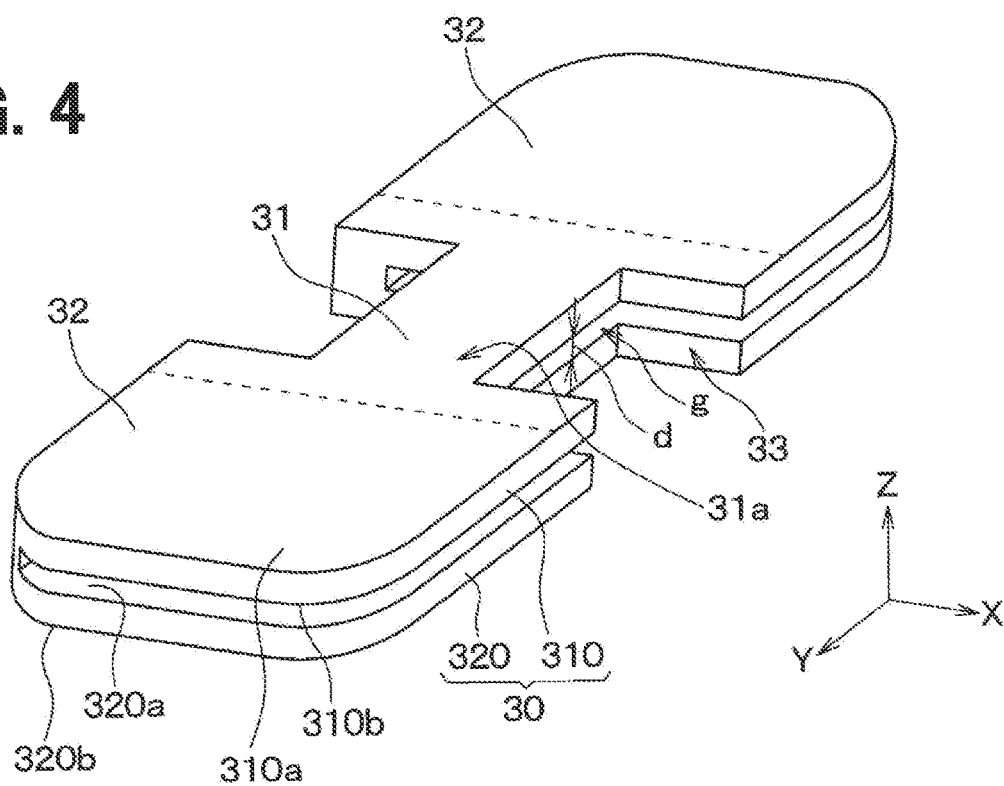
FIG. 4 is a diagram illustrating a perspective view of a bus bar.

Hereinafter, as shown in FIG. 4, the portion of the bus bar 30 covered by the sensor housing 10 is referred to as a covered portion 31, and the portions exposed from the sensor housing 10 are referred to as fastening portions 32. As shown in FIG. 2, the fastening portion 32 is formed with a fastening hole 34 used to attach the fastening portion to an attachment member. In FIG. 4, a dotted line indicates a boundary between the covered portion 31 and the fastening portion 32. In FIG. 4, illustration of the fastening hole 34 is omitted.

In the present embodiment, a direction intersecting the longitudinal direction is referred to as a width direction (which is along the X-axis direction in FIG. 3 and FIG. 4). The covered portion 31 is formed with a narrow portion 31a a length of which in the width direction is shorter than that of the fastening portion 32 (hereinafter, the length in the width direction will be simply referred to as the width). In the covered portion 31 of the present embodiment, the narrow portion 31a is provided by forming cutout portions 33. Assumed that a surface of the bus bar 30 that intersects an XY plane and a YZ plane is referred to as a side surface. In the present embodiment, the cutout portion 33 is formed so that side surfaces of the cutout portion 33 are parallel to the X-axis direction (that is, to be orthogonal to the longitudinal direction of the bus bar 30).

FIG. 4 illustrates an example in which the cutout portion 33 is formed at a position closer to the covered portion 31 than the boundary portion between the covered portion 31 and the fastening portion 32. Alternatively, the cutout portion 33 may be formed at the boundary portion between the covered portion 31 and the fastening portion 32. That is, the narrow portion 31a may be formed in the entirety of the covered portion 31. The shape of the cutout portion 33 can be changed as appropriate. For example, the cutout portion 33 may be formed to have a tapered portion so that the width of the cutout portion 33 gradually decreases toward the narrow portion 31a.

The bus bar 30 of the present embodiment is configured by the first bus bar 310 and the second bus bar 320 stacked in the Z-axis direction. Hereinafter, the surface of the first bus bar 310 on the second bus bar 320 side is referred to as the other surface 310b, and the surface of the first bus bar 310 on the side opposite to the other surface 310b is referred to as the one surface 310a. Similarly, the surface of the second bus bar 320 on the first bus bar 310 side is referred to as the one surface 320a, and the surface of the second bus bar 320 on the side opposite to the one surface 320a is referred to as the other surface 320b.

In the bus bar 30 of the present embodiment, the first bus bar 310 and the second bus bar 320 connect to each other at the fastening portion 32, and are thus integral. Specifically, the first bus bar 310 and the second bus bar 320 are integral as being formed by bending a single flat plate. Therefore, the first bus bar 310 and the second bus bar 320 connect to each other at an end in the width direction. Although not particularly limited, in the present embodiment, the bus bar 30 is formed by bending a copper plate having a plate thickness of 1.6 mm.

The first bus bar 310 and the second bus bar 320 are not connected to each other at the narrow portion 31a. In addition, the cutout portion 33 constituting the narrow portion 31a may be formed before the flat plate constituting the bus bar 30 is bent or may be formed after the flat plate is bent.

The first bus bar 310 and the second bus bar 320 are arranged such that a gap g having a predetermined gap length d is formed between the first bus bar 310 and the second bus bar 320 in the narrow portion 31a. In the bus bar 30 of the present embodiment, the first bus bar 310 and the second bus bar 320 are arranged such that the gap g is constant over the fastening portions 32 and the covered portion 31. The bus bar 30 may be formed with a plating film or the like for preventing oxidation, as necessary.

The sensor unit 40 outputs a detection signal according to a signal magnetic field transmitted through the sensor unit 40. The sensor unit 40 includes, for example, a Hall element, a TER (abbreviation of tunnel magneto resistance) element, a MGR. (abbreviation of giant magneto resistance) element, an AMR (abbreviation of anisotropic magneto resistance) element, or the like.

As shown in FIGS. 2 and 3, the wiring substrate 50 is provided by a printed circuit board or the like having one surface 50a and the other surface 50b. The wiring substrate 50 is appropriately formed with a wiring pattern, a signal processing circuit, and the like, and electronic components (not shown) are mounted thereon. The sensor unit 40 is mounted on the other surface 50b of the wiring substrate 50 so as to be electrically connected to the wiring pattern or the like.

In the present embodiment, one sensor unit 40 is provided. However, a plurality of the sensor units 40 may be provided along the Y-axis direction. Further, the first current sensor 1a shares the wiring substrate 50 with the second current sensor 1b and the third current sensor 1c, and the sensor unit 40 is provided at a portion constituting each of the current sensors.

The wiring substrate 50 is formed with a plurality of through vias 51, and the guide recess portion 52 corresponding to the guide projection portion 102 formed in the first accommodation recess 101. Although a detailed configuration of the through via 51 is omitted, the through via 51 is formed by a through hole electrode or the like that is formed in a through hole and is electrically connected to the wiring pattern.

The wiring substrate 50 is fixed to the first accommodation recess 101 of the sensor housing 10 such that the other surface 50b faces the bus bar 30. Specifically, the wiring substrate 50 is disposed in the first accommodation recess 101 such that the guide recess portion 52 is fitted to the guide projection portion 102. Further, in the wiring substrate 50, the one end portion of the connection terminal 20 is inserted into the through via 51, so the through via 51 is electrically and mechanically connected to the connection terminal 20 via a conductive member 60 such as solder. In addition, the wiring substrate 50 is mechanically connected so that the other surface 50b is connected with the substrate bonding portion 104 through a bonding member 61 such as an adhesive disposed between the other surface 50b and the substrate bonding portion 104 while the other surface 50b is in contact with the substrate support portion 103.

Further, the wiring substrate 50 is disposed in the first accommodation recess 101 so that the YZ plane becomes the sensitive surface of the sensor unit 40. That is, the wiring substrate 50 is disposed in the first accommodation recess 101 so that the sensor unit 40 outputs a detection signal corresponding to the magnetic field along the X-axis direction. Further, the wiring substrate 50 is accommodated in the first accommodation recess 101 such that the sensor unit 40 is disposed at a position separated by a predetermined distance in the X-axis direction from a portion facing the center of the narrow portion 31a of the bus bar 30 in the width direction (hereinafter, the center of the narrow portion 31a of the bus bar 30 in the width direction will be also simply referred to as the center of the narrow portion 31a).

Since the sensor unit 40 is disposed in a manner described above, the arrangement direction of the sensor unit 40 and the bus bar 30 corresponds to a direction along the Z-axis direction, and corresponds to a direction along the stacking direction of the first bus bar 310 and the second bus bar 320. In addition, the sensor unit 40 being located at the position separated by the predetermined distance from the portion facing the center of the narrow portion 31a means that the sensor unit 40 is arranged so that the amplitude ratio becomes 100%, though will be specifically described later. As described above, the shield support portion 105 and the shield bonding portion 106 are formed in the first accommodation recess 101 so as to protrude from the outer side of the wiring substrate 50 toward the one surface 50a of the wiring substrate 50, when the wiring substrate 50 is disposed in the first accommodation recess 101.

The first shield portion 71 and the second shield portion 72 are each made of a material having a magnetic permeability higher than that of the sensor housing 10. The first shield portion 71 and the second shield portion 72 are each made of a soft magnetic material having a high magnetic permeability such as permalloy or an electromagnetic steel sheet, and have a flat plate shape. The first shield portion 71 and the second shield portion 72 of the present embodiment each have a configuration in which a plurality of flat plates are stacked and integrated at a press-fitted portion 710. The first shield portion 71 and the second shield portion 72 may be provided independently for the first to third current sensors 1a to 1c or may be shared by the first to third current sensors 1a to 1c.

As shown in FIG. 2, the first shield portion 71 has a rectangular shape in a plan view viewed along the Z-axis direction, and cutout portions 71a are formed at corner portions. The second shield portion 72 is configured to include a flat plate portion 72a having a rectangular shape in a plan view and the wall portions 72b bent at opposite sides of the flat plate portion 72a. In the present embodiment, the wall portions 72b are formed by bending both end portions of the second shield portion 72 in the X-axis direction.

The first shield portion 71 and the second shield portion 72 each have a length in the X-axis direction that is larger than the length (that is, the width) of the bus bar 30 in the X-axis direction.

The first shield portion 71 and the second shield portion 72 are disposed in the sensor housing 10 such that the wiring substrate 50 and the bus bar 30 are located between the first shield portion 71 and the second shield portion 72.

Specifically, in a cross section different from the cross-section shown in FIG. 3, the first shield portion 71 is arranged on the shield support portion 105 and is disposed in the first accommodation recess 101 via the bonding member disposed on the shield bonding portion 106.

The second shield portion 72 is disposed to be in contact with the shield support portion 112 while the wall portions 72b are inserted in the groove portions 113, and is fixed through the bonding member 114 disposed on the bottom surface of the second accommodation recess 111. The second shield portion 72 may be fixed to the sensor housing 10 by insert molding.

The lid portion 80 is made of a resin material, and has a shape corresponding to the outer shape of the base portion 100 on the one surface 100a side of the sensor housing 10, as shown in FIGS. 1 and 2. The lid portion 80 is formed with the coupling recess 81 corresponding to the coupling protrusion 130 of the sensor housing 10. That is, the sensor housing 10 and the lid portion 80 are formed with a pair of fitting portions. The lid portion 80 is disposed so as to cover the first accommodation recess 101 of the base portion 100 and is fixed to the sensor housing 10 such that the coupling protrusion 130 is coupled to the coupling recess 81 in a snap-fitted manner.

The current sensor 1 of the present embodiment has the configurations as described above. In such a current sensor 1, an alternating current flows through the bus bar 30 of each of the first to third current sensors 1a to 1c, so that a signal magnetic field is generated around the bus bar 30 of each of the first to third current sensors 1a to 1c according to Ampere's law. In the present embodiment, each bus bar 30 is arranged along the Y-axis direction, and the current flows in the direction along the Y-axis direction, so that the signal magnetic field is generated around the Y-axis direction. The sensor unit 40 of each of the first to third current sensors 1a to 1c outputs a detection signal corresponding to the signal magnetic field. As a result, the alternating current flowing through the bus bar 30 of each of the first to third current sensors 1a to 1c is detected.

When the alternating current flows through the bus bar 30, the alternating current is likely to be easily concentrated on end portions of the bus bar 30 due to a skin effect in a cross section (that is, in a XZ plane) that defines a normal direction along the current flow direction. In the present embodiment, the bus bar 30 is formed by the stack of the first bus bar 310 and the second bus bar 320, and the gap g is defined between the first bus bar 310 and the second bus bar 320 in the narrow portion 31a. Therefore, in the narrow portion 31a, the other surface 310b of the first bus bar 310 and the one surface 320a of the second bus bar 320 form the end portions where the alternating current is easily concentrated. That is, in the narrow portion 31a of the present embodiment, the portion where the alternating current is easily concentrated is also formed inside the bus bar 30.

Here, a current sensor in which the bus bar 30 is formed of one flat plate and has a rectangular shape in a cross-section defining a normal direction along the current flow direction is referred to as a conventional current sensor (hereinafter, this current sensor is also simply referred to as the conventional current sensor). In this case, as compared with the conventional current sensor, the portion where the alternating current is easily concentrated is also formed inside the bus bar 30 in the current sensor 1 of the present embodiment, and thus it is possible to reduce a change in current density along the X-axis direction of the bus bar 30. Therefore, even if the position of the sensor unit 40 is deviated in the X-axis direction when the sensor unit 40 is arranged at a target position separated by the predetermined distance in the X-axis direction from the portion facing the center of the bus bar 30, the change in detection accuracy can be reduced. That is, in the current sensor 1 of the present embodiment, it is possible to improve the robustness with respect to the positional deviation of the sensor unit 40 in the X-axis direction.

When the bus bar 30 is configured by the stack of the first bus bar 310 and the second bus bar 320, the alternating current flows through the first bus bar 310 and the second bus bar 320. In this case, by increasing the gap length d, the influence of the proximity effect can be reduced, and the decrease in the current density of the other surface 310b of the first bus bar 310 and the one surface 320a of the second bus bar 320 can be suppressed. Therefore, according to the current sensor 1 of the present embodiment, the change in the current density along the X-axis direction of the bus bar 30 can be reduced as the gap length d is increased. Therefore, in the current sensor 1 of the present embodiment, it is possible to improve the robustness with respect to the positional deviation of the sensor unit 40 in the X-axis direction.

Figure 5:
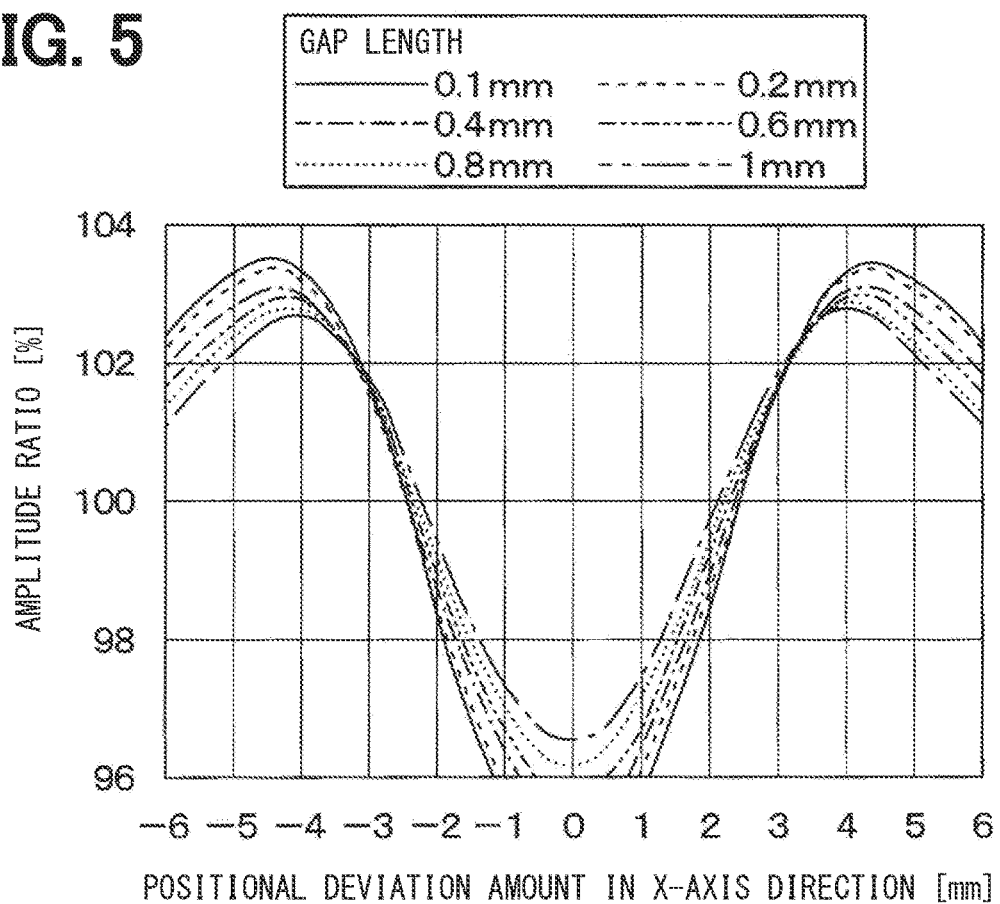
FIG. 5 is a diagram illustrating a relationship between the amount of positional deviation of a sensor unit in an X-axis direction and an amplitude ratio with respect to a gap length.

Specifically, the amount of positional deviation of the sensor unit 40 in the X-axis direction and the amplitude ratio have a relationship as shown in FIG. 5. The amount of positional deviation of the sensor unit 40 in the X-axis direction and the gap length d have a relationship as shown in FIG. 6.

Here, a reference value is a value of a signal magnetic field generated when a direct current is caused to flow through the bus bar 30. The amplitude ratio in the present embodiment is a ratio of a signal magnetic field that is formed when an alternating current having a maximum current value equal to the direct current flows in the bus bar 30 to the reference value. The amount of positional deviation in the X-axis direction is a distance of the sensor unit 40 from a reference portion facing the center of the bus bar 30 in the X-axis direction (hereinafter simply referred to as the reference), when the sensor unit 40 is arranged at a position shifted in the X-axis direction. The reference facing the center of the bus bar 30 is a position at which the amount of positional deviation in the X-axis direction is zero. In FIG. 5, the width of the narrow portion 31a of the bus bar 30 is 8 mm.

In a case where the current sensor 1 as in the present embodiment is mounted on a vehicle, the current sensor 1 is expected to have an amplitude ratio in a range of 99.5 to 100.5% according to the current demand. Hereinafter, the amount of positional deviation in the X-axis direction of the sensor unit 40 at which the amplitude ratio is 100% is also referred to as an optimum position. In addition, the amount of positional deviation of the sensor unit 40 in the X-axis direction in which the amplitude ratio is in the range of 99.5 to 100.5% is also referred to as an optimum range. In FIG. 6, the amount of positional deviation (that is, the optimum position) in the X-axis direction of the sensor unit 40 at which the amplitude ratio is 100% is plotted. In addition, in FIG. 6, the amount of positional deviation (that is, the optimum range) in the X-axis direction of the sensor unit 40 in which the amplitude ratio is in the range of 99.5 to 100.5% is indicated by an arrow.

Figure 6:
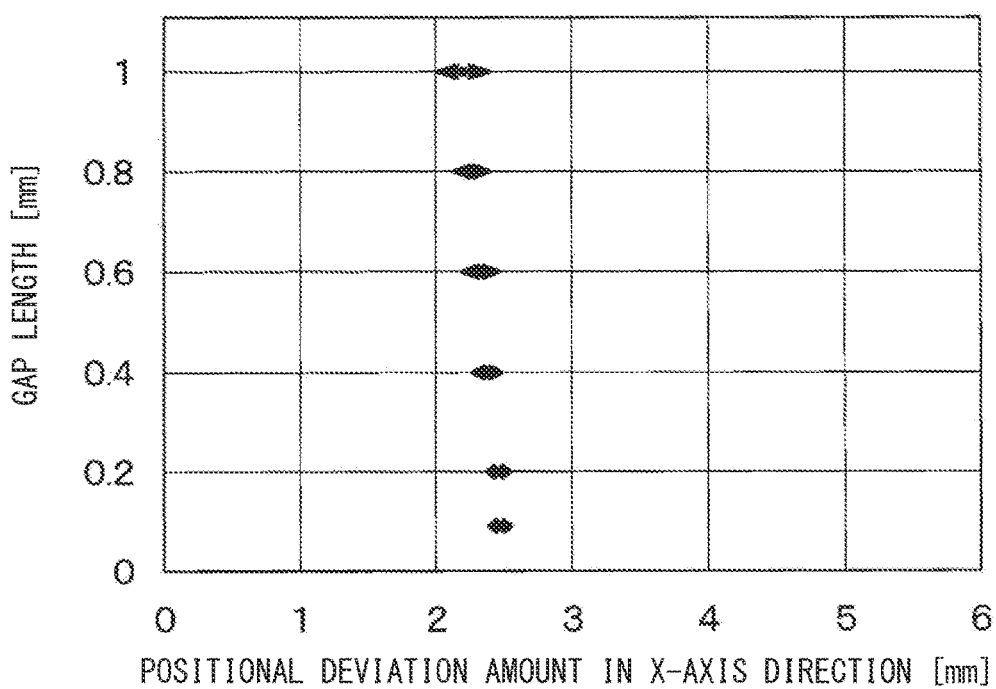
FIG. 6 is a diagram illustrating a relationship between the amount of positional deviation of the sensor unit in the X-axis direction and the gap length.

As shown in FIGS. 5 and 6, in the current sensor 1 of the present embodiment, it is confirmed that the change in amplitude ratio due to the positional deviation in the X-axis direction of the sensor unit 40 is reduced with the increase in the gap length d. Further, it is confirmed that the optimum position of the sensor unit 40 becomes closer to the reference as the gap length d becomes longer, and the optimum range of the sensor unit 40 becomes larger as the gap length d becomes longer.

For example, in the current sensor 1 of the present embodiment, when the gap length d is set to 1 mm, the sensor unit 40 may be disposed at a position shifted by 2.0 to 2.4 mm in the X-axis direction from the reference in order to make the amplitude ratio in the range of 99.5 to 100.5%. Therefore, according to the current sensor 1 of the present embodiment, it is possible to improve the robustness with respect to the positional deviation of the sensor unit 40 in the X-axis direction. As described above, the amplitude ratio changes as the gap length d changes. Therefore, in the bus bar 30, it is preferable to fix the fastening portion 32 by swaging, welding, or the like so that the gap length d does not easily vary from the target value.

According to the present embodiment described above, the bus bar 30 is configured by the stack of the first bus bar 310 and the second bus bar 320 having the gap g therebetween. Therefore, it is possible to improve the robustness with respect to the positional deviation of the sensor unit 40 in the X-axis direction.

(1) In the present embodiment, the covered portion 31 of the bus bar 30 is formed with the cutout portion 33 to have the narrow portion 31a having the width smaller than that of the fastening portion 32. Therefore, it is possible to suppress the decrease in the current density flowing through the center of the narrow portion 31a, as compared with a case where the narrow portion 31a is not formed.

(2) In the present embodiment, the bus bar 30 is formed by using a single flat plate, and the first bus bar 310 and the second bus bar 320 are connected to each other at one end in the width direction. Therefore, the number of members can be reduced.

(3) In the present embodiment, the first shield portion 71 and the second shield portion 72 are each formed by stacking flat plates. Therefore, as compared with a case where the first shield portion 71 and the second shield portion 72 are each formed of one flat plate having the same thickness as that of the present embodiment, the eddy current is less likely to flow, and the eddy current loss can be reduced.

Modification of First Embodiment

A modification of the first embodiment will be described hereinafter. In the first embodiment described above, the bus bar 30 may be in a state in which the first bus bar 310 and the second bus bar 320 are in contact with each other at the fastening portions 32. For example, the first bus bar 310 and the second bus bar 320 may be in contact with each other at the fastening portions 32 by welding, crimping, or the like. In such a case, since the first bus bar 310 and the second bus bar 320 are in contact with each other at the fastening portions 32 and thus can be regarded as one conductor, it is possible to suppress an increase in heat generation due to an increase in resistance.

Second Embodiment

A second embodiment will be described hereinafter. The present embodiment is different from the first embodiment in that a projection is formed on the first bus bar 310. The other configurations of the present embodiment are similar to those of the first embodiment, and therefore a description of the similar configurations will be omitted.

Figure 7:
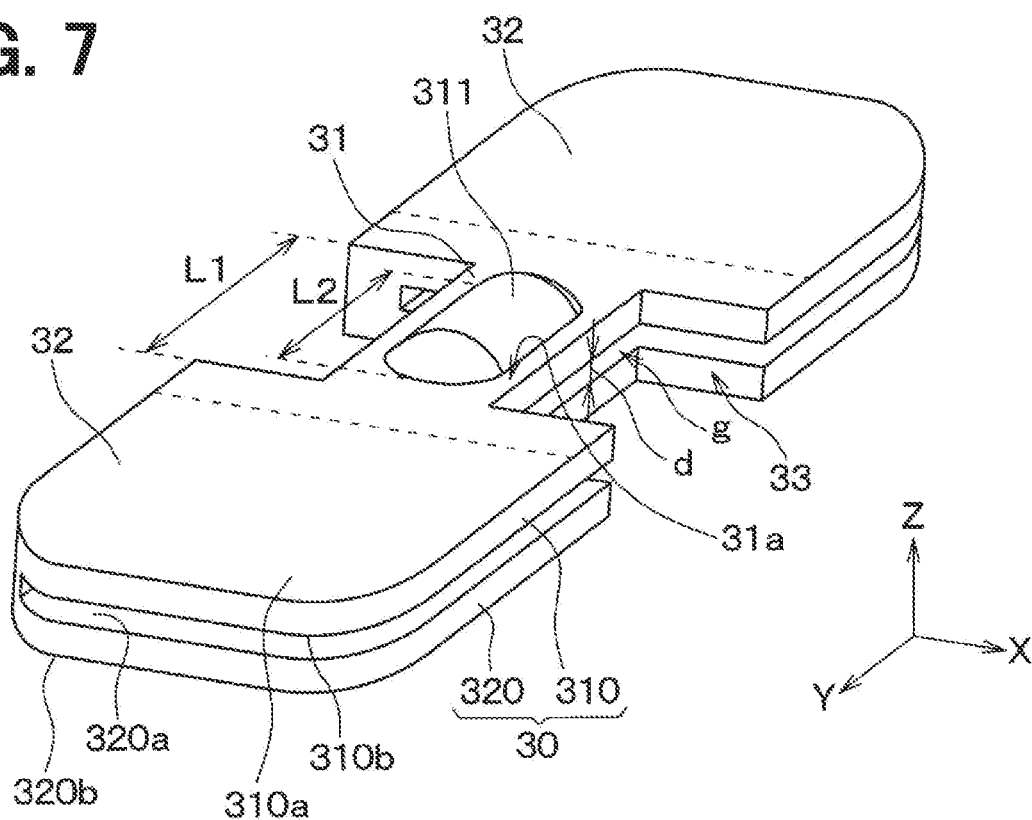
FIG. 7 is a diagram illustrating a perspective view of a bus bar according to a second embodiment.
Figure 8:
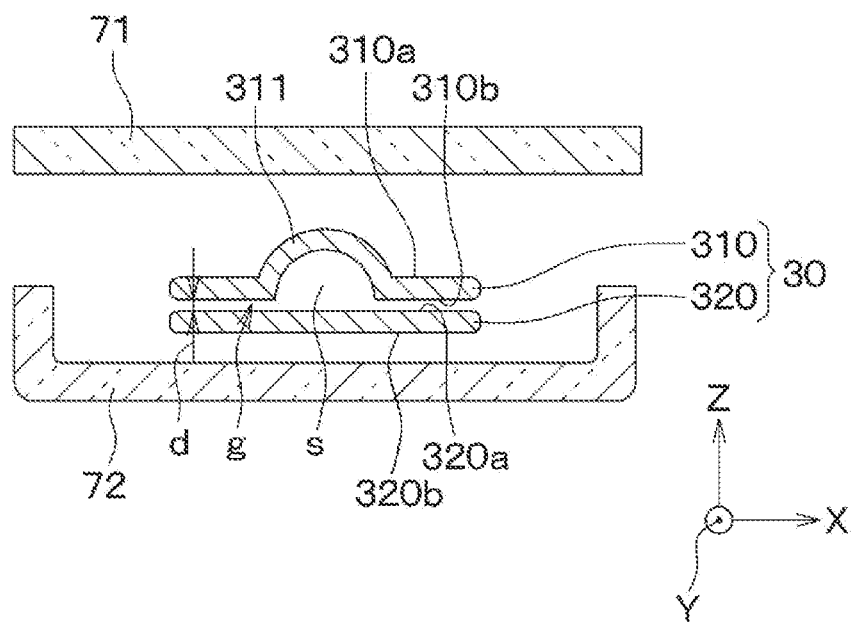
FIG. 8 is a diagram illustrating a cross-sectional view of a first current sensor according to a second embodiment.

In the present embodiment, as shown in FIGS. 7 and 8, the narrow portion 31a of the first bus bar 310 is provided with a protrusion 311 protruding on the one surface 310a side. That is, the first bus bar 310 is formed with the protrusion 311 protruding on a side opposite to the second bus bar 320. Therefore, a space S is provided by the protrusion 311 between the first bus bar 310 and the second bus bar 320. The space S is a portion provided due to the gap g being widened, and can also be said to be a portion in which the gap length d is increased. FIG. 8 is a cross-sectional view corresponding to FIG. 3 and shows only the positional relationship among the bus bar 30, the first shield portion 71, and the second shield portion 72 for easy understanding.

The protrusion 311 of the present embodiment has a shape including a rectangular section having a rectangular shape and arcuate sections disposed at both ends of the rectangular section in a plan view viewed along the X-axis direction. The protrusion 311 of the present embodiment is formed such that the center in the width direction coincides with the center in the width direction of the narrow portion 31a and the center in the longitudinal direction coincides with the center in the longitudinal direction of the narrow portion 31a. In a cross-section of the protrusion 311 having a normal direction along the current flow direction (that is, in FIG. 8), the radius of the protrusion 311 is the plate thickness (that is, 1.6 mm), for example. The length of the protrusion 311 in the width direction is, for example, ½ or more of the length of the narrow portion 31a in the width direction. Note that such a protrusion 311 is formed by, for example, press working or the like.

According to the present embodiment described above, since the bus bar 30 is configured by the stack of the first bus bar 310 and the second bus bar 320 such that the gap g is provided between the first bus bar 310 and the second bus bar 320, it is possible to obtain the similar effects to those of the first embodiment.

(1) In the present embodiment, the first bus bar 310 is formed with the protrusion 311. Therefore, it is possible to further improve the robustness with respect to the positional deviation of the sensor unit 40 in the X-axis direction.

That is, by forming the protrusion 311 in the first bus bar 310, it is possible to increase a portion serving as the end portion in an inner area in the width direction of the bus bar 30, and it is possible to further suppress a decrease in the current density at the center in the width direction due to the skin effect. Further, since the space S is provided by forming the protrusion 311 in the first bus bar 310, the proximity effect can be further reduced. Therefore, according to the current sensor 1 of the present embodiment, it is possible to further reduce the change in the current density in the width direction of the bus bar 30, and it is possible to further improve the robustness with respect to the positional deviation of the sensor unit 40 in the X-axis direction.

Figure 9:
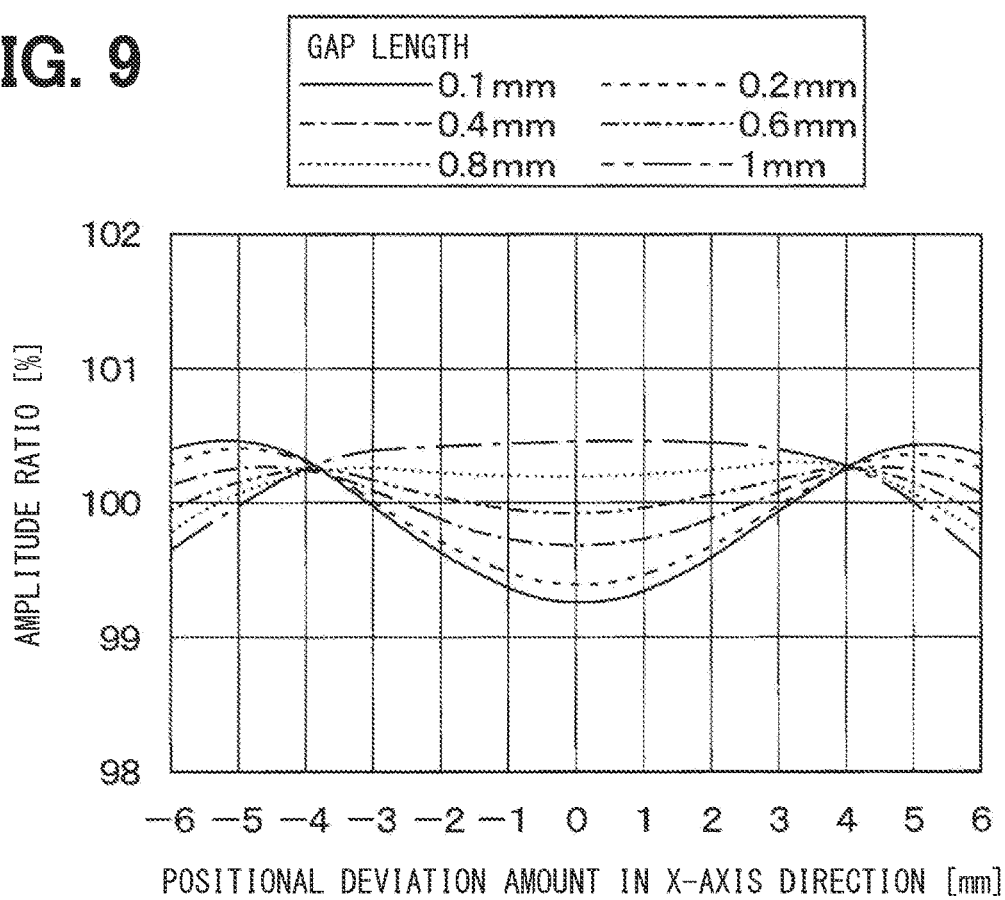
FIG. 9 is a diagram illustrating a relationship between the amount of positional deviation of a sensor unit in an X-axis direction and an amplitude ratio with respect to a gap length.
Figure 10:
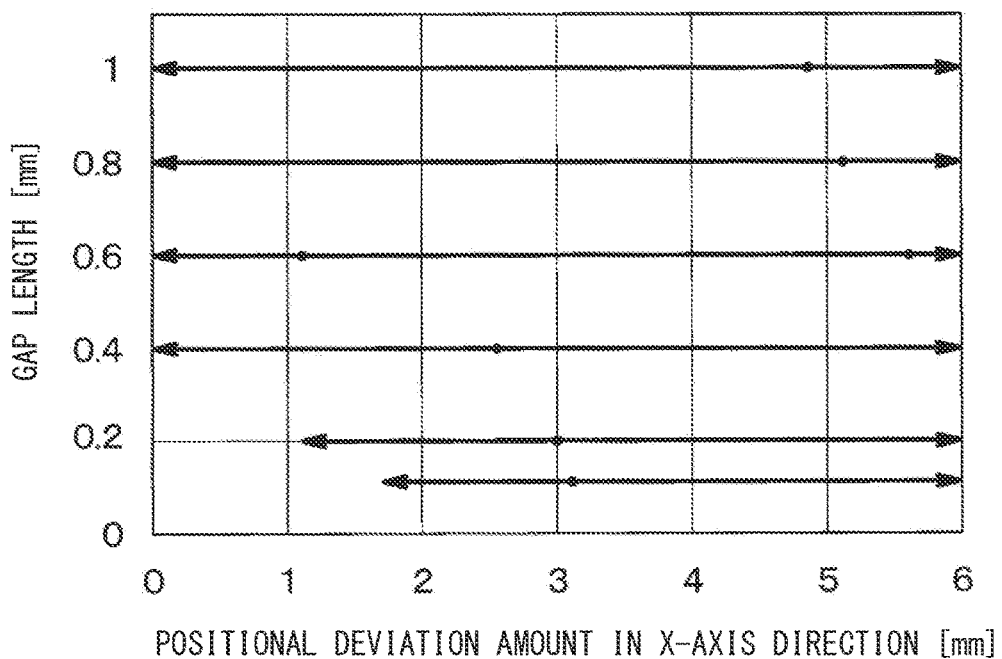
FIG. 10 is a diagram illustrating a relationship between the amount of positional deviation of the sensor unit in the X-axis direction and the gap length.

Specifically, when the current sensor 1 of the present embodiment is compared with FIGS. 5 and 6 described in the first embodiment, as shown in FIGS. 9 and 10, in a case where the gap length d is the same, it is confirmed that the change in the amplitude ratio with respect to the amount of positional deviation of the sensor unit 40 in the X-axis direction can be significantly reduced. For example, in a case where the gap length d is 1 mm, in the current sensor 1 of the present embodiment, the sensor unit 40 can be disposed at a position shifted by 0 to 6 mm from the reference in the X-axis direction in order to make the amplitude ratio to be in the range of 99.5 to 100.5%. Therefore, it is possible to further improve the robustness with respect to the positional deviation of the sensor unit 40 in the X-axis direction. FIGS. 9 and 10 show the results when the width of the narrow portion 31a is 8 mm and the radius of the protrusion 311 is the plate thickness (that is, 1.6 mm).

In the current sensor 1 according to the present embodiment, the following requirements also affect the amplitude ratio and the like. For this reason, in the current sensor 1, it is preferable that the following requirements be adjusted according to conditions in use (for example, the maximum value of the alternating current), conditions to be required, or the like.

Figure 11:
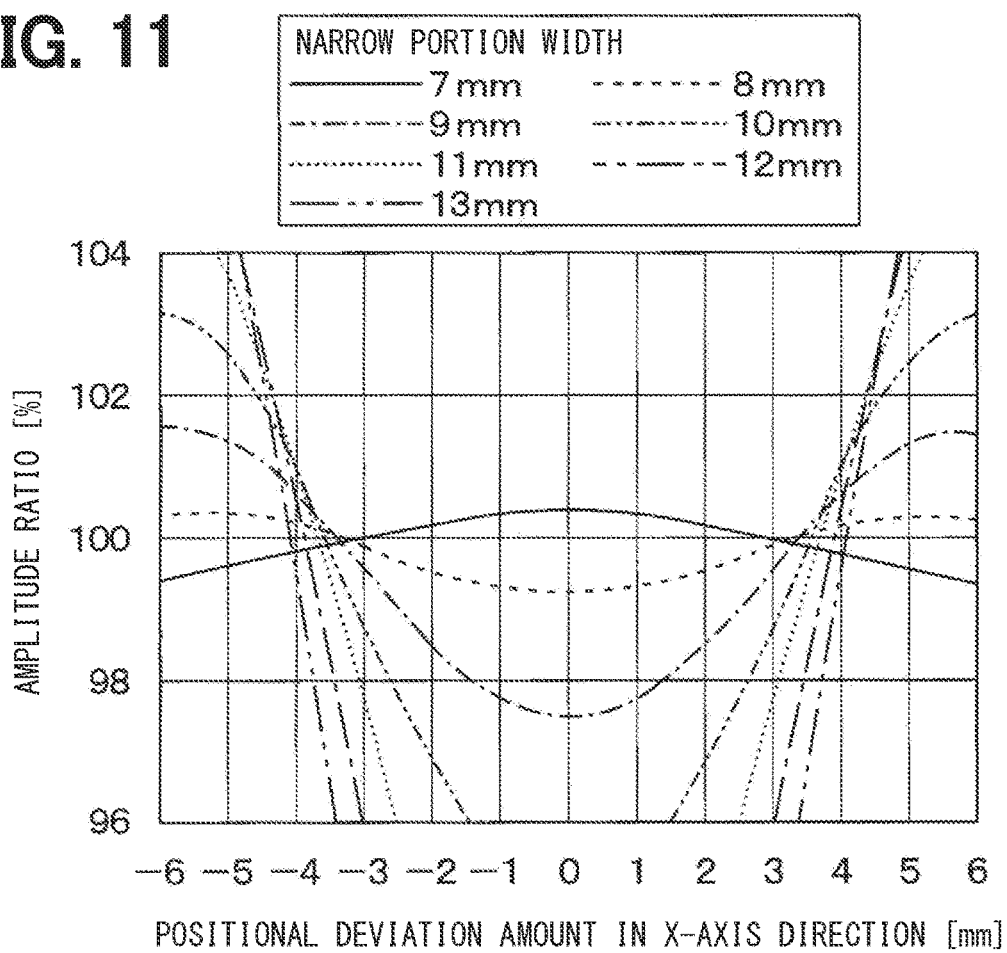
FIG. 11 is a diagram illustrating a relationship between the amount of positional deviation of the sensor unit in the X-axis direction and an amplitude ratio with respect to the width of a narrow portion.
Figure 12:
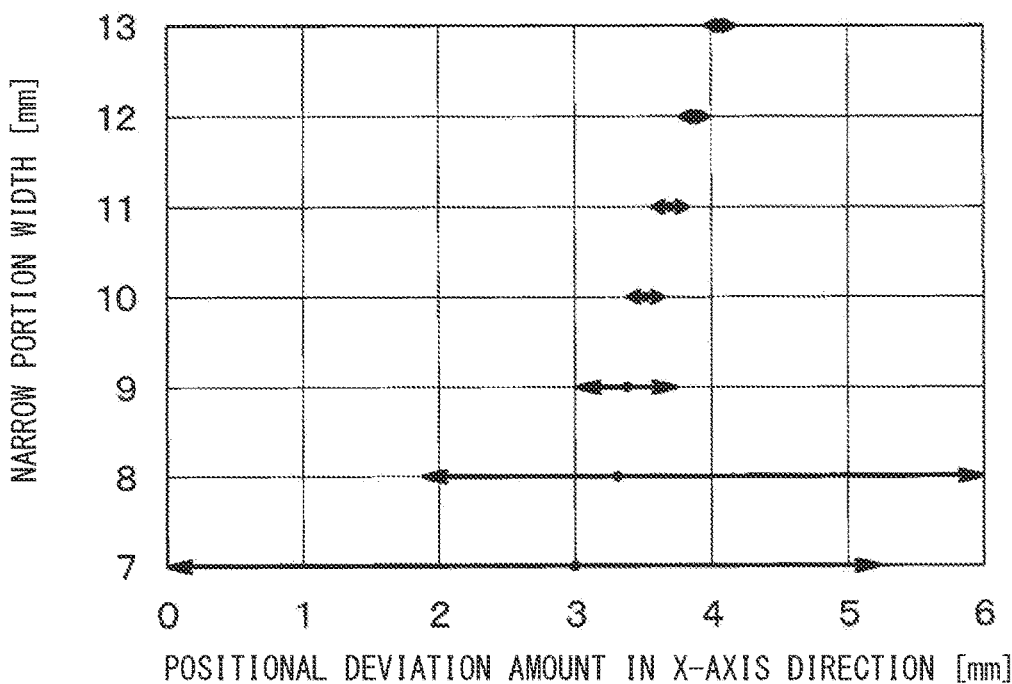
FIG. 12 is a diagram illustrating a relationship between the amount of positional deviation of the sensor unit in the X-axis direction and the width of the narrow portion.

Specifically, as shown in FIGS. 11 and 12, it is confirmed that the optimum position of the sensor unit 40 increases as the width of the narrow portion 31a increases. Further, it is confirmed that the optimum range of the sensor unit 40 increases as the width of the narrow portion 31a decreases. For example, in a case where the width of the narrow portion 31a is 7 mm, the optimum position of the sensor unit 40 is at the position shifted by 3 mm from the reference in the X-axis direction. The optimum range of the sensor unit 40 is about 0 to 5 mm shifted from the reference in the X-axis direction. FIGS. 11 and 12 show the results obtained when the gap length d is 0.1 mm.

Figure 13:
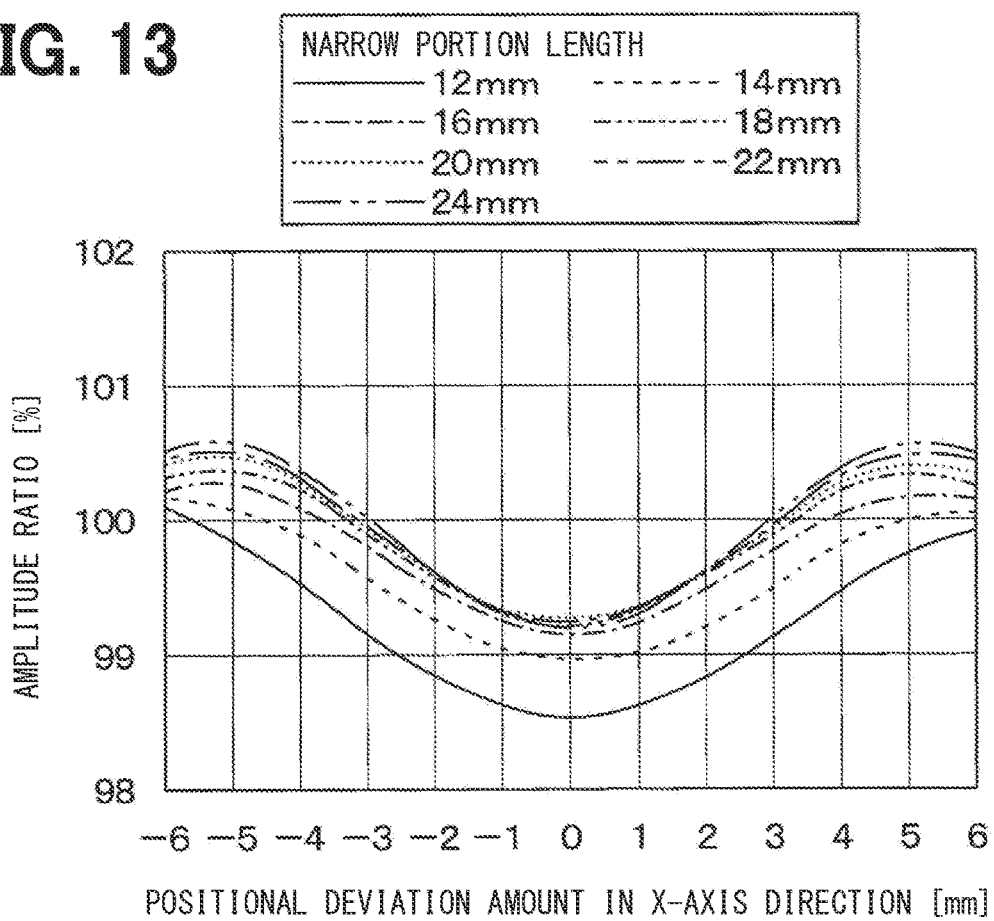
FIG. 13 is a diagram illustrating a relationship between the amount of positional deviation of the sensor unit in the X-axis direction and an amplitude ratio with respect to the length of the narrow portion.
Figure 14:
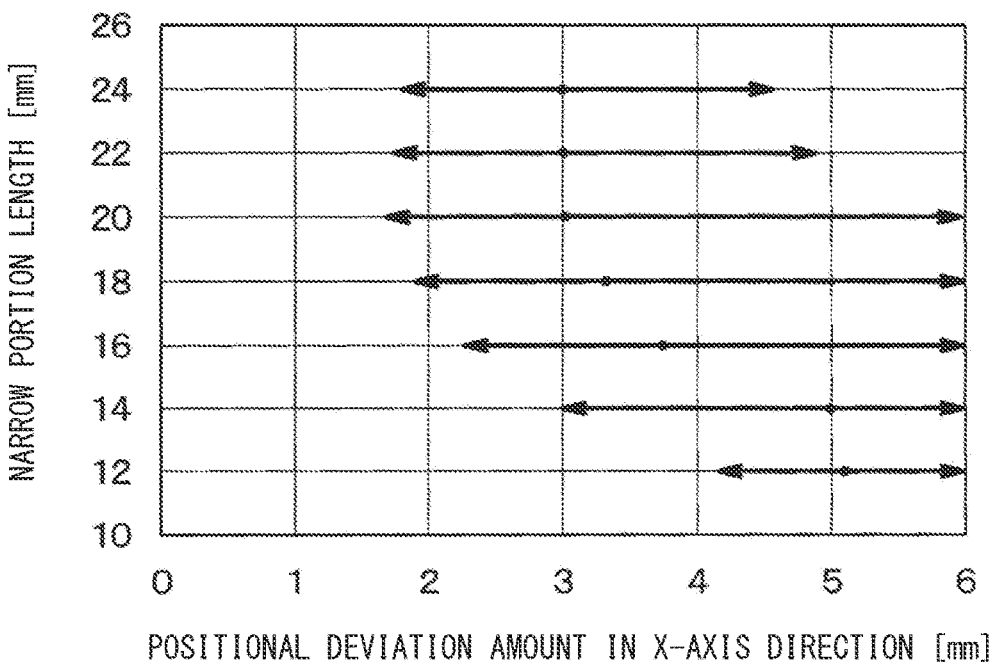
FIG. 14 is a diagram illustrating a relationship between the amount of positional deviation of the sensor unit in the X-axis direction and the length of the narrow portion.

Further, as shown in FIG. 7, the length of the narrow portion 31a in the Y-axis direction is referred to as a narrow-portion length L1, and the length of the protrusion 311 in the Y-axis direction is referred to as a protrusion length L2. In this case, when the narrow-portion length L1 is changed while the protrusion length L2 is constant, the relationship between the amount of positional deviation of the sensor unit 40 in the X-axis direction and the amplitude ratio is shown in FIGS. 13 and 14. FIGS. 13 and 14 show the results obtained when the width of the narrow portion 31a is 8 mm, the protrusion length L2 is 10 mm, and the gap length d is 0.1 mm.

As shown in FIGS. 13 and 14, when the narrow-portion length L1 is increased, the current density is likely to be uniform at the center in the longitudinal direction in the narrow portion 31a. Therefore, it is confirmed that when the narrow-portion length L1 is increased, the optimum position of the sensor unit 40 is moved toward the reference, and the optimum range of the sensor unit 40 is also increased. However, in the current sensor 1 of the present embodiment, since the optimum position less changes when the narrow-portion length L1 is 20 mm or more, the narrow-portion length L1 is preferably set to 20 mm or more.

Figure 15:
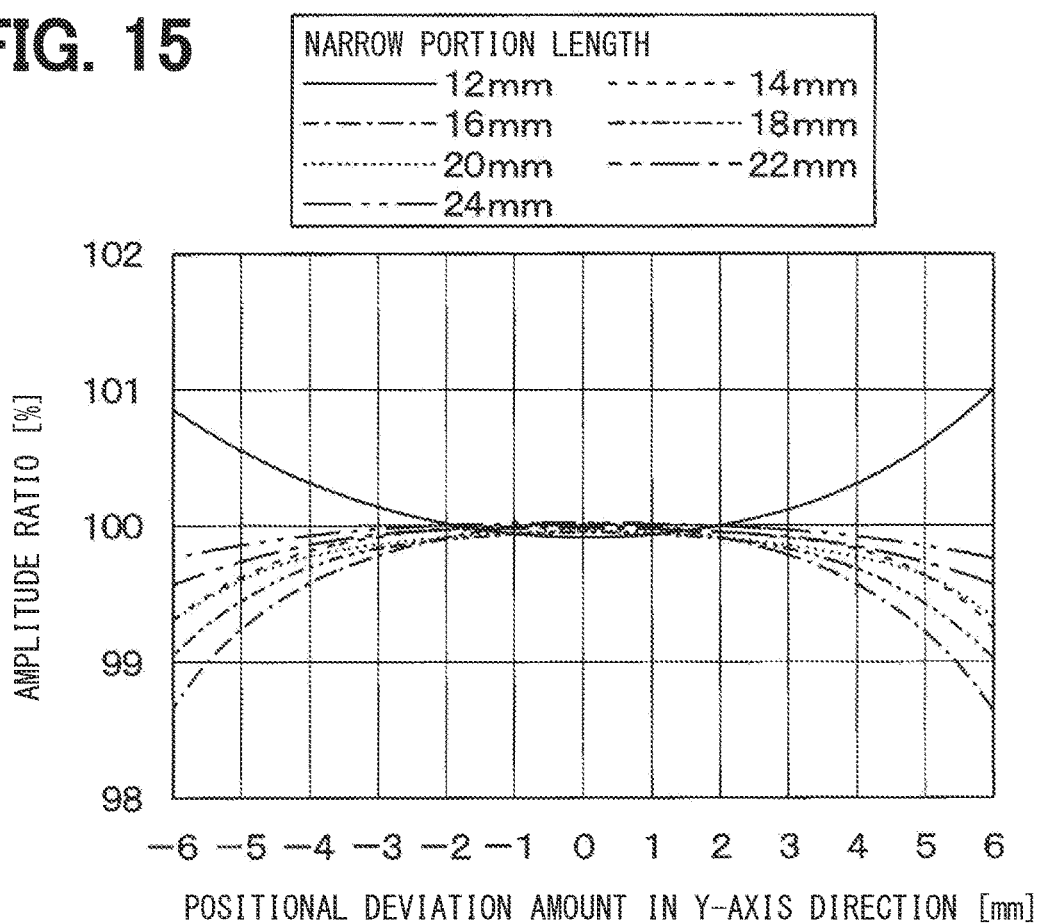
FIG. 15 is a diagram illustrating a relationship between the amount of positional deviation of the sensor unit in a Y-axis direction and an amplitude ratio with respect to the length of the narrow portion.
Figure 16:
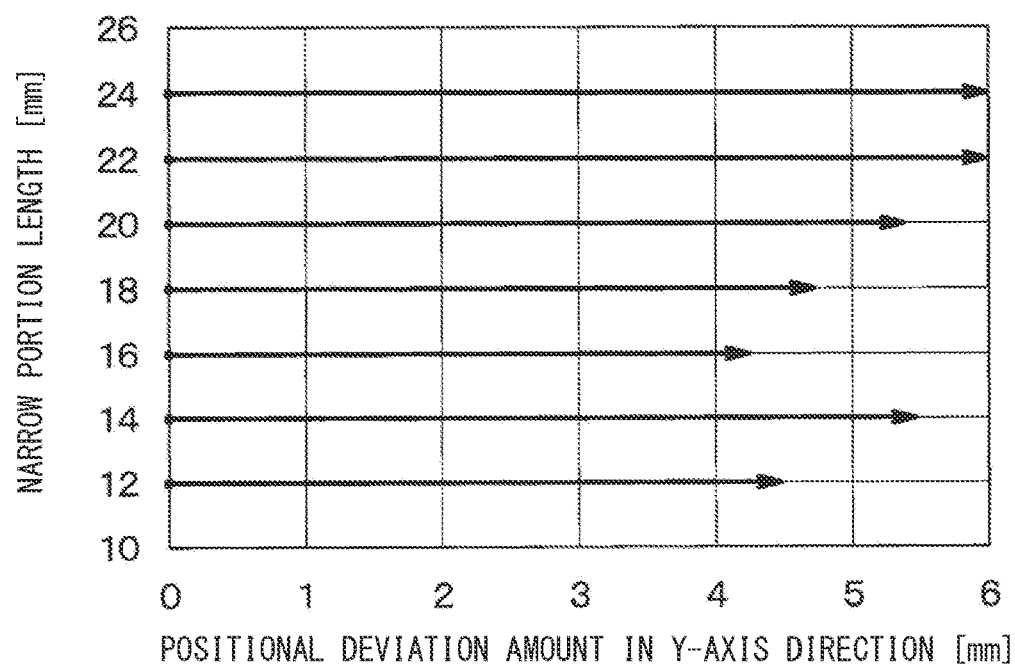
FIG. 16 is a diagram illustrating a relationship between the amount of positional deviation of the sensor unit in the Y-axis direction and the length of the narrow portion.

In addition, when the narrow-portion length L1 is changed while the protrusion length L2 is constant, the relationship between the amount of positional deviation of the sensor unit 40 in the Y-axis direction and the amplitude ratio is as shown in FIGS. 15 and 16. FIGS. 15 and 16 show the results obtained when the width of the narrow portion 31a is 8 mm, the protrusion length L2 is 10 mm, and the gap length d is 0.1 mm.

As shown in FIGS. 15 and 16, it is confirmed that the amount of positional deviation in the Y-axis direction of the sensor unit 40 in which the amplitude ratio is 100% hardly changes even when the narrow-portion length L1 is changed. However, since the current density is less likely to be uniform as the distance from the center of the narrow portion 31a in the Y-axis direction increases, the amplitude ratio is more likely to change as the amount of positional deviation in the Y-axis direction increases. Therefore, the sensor unit 40 is preferably arranged so as to face the center of the narrow portion 31a in the Y-axis direction.

Figure 17:
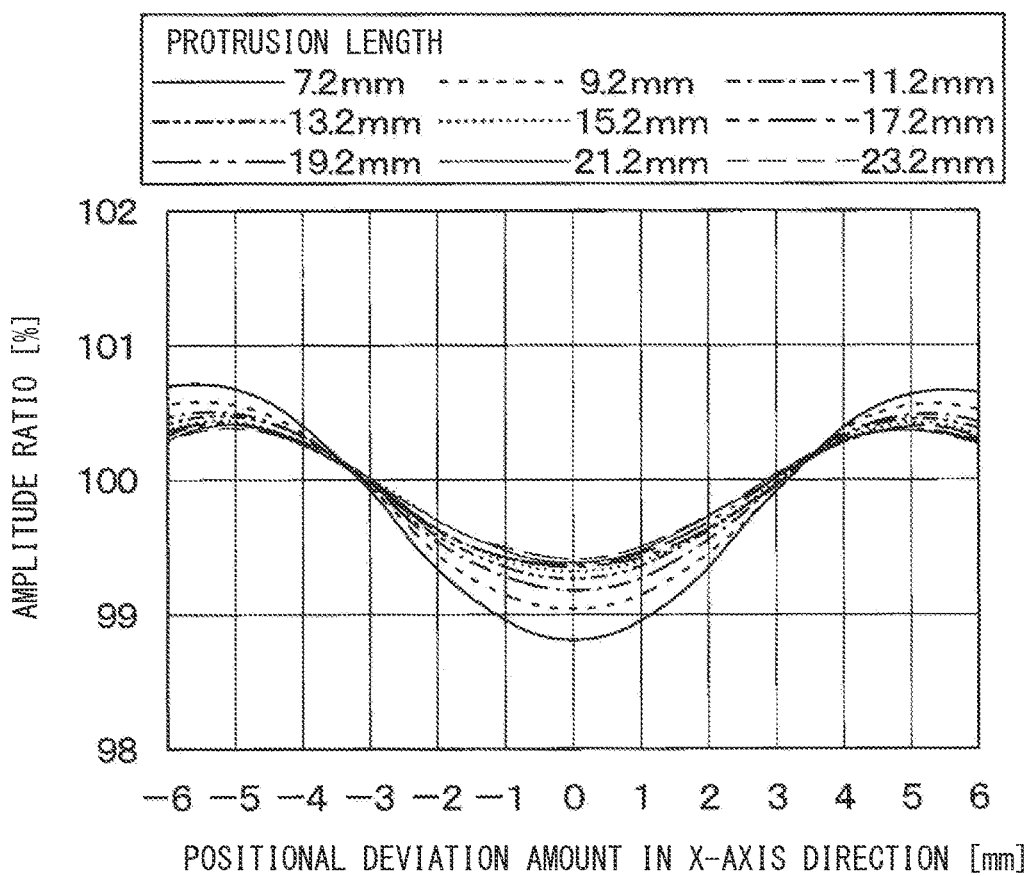
FIG. 17 is a diagram illustrating a relationship between the amount of positional deviation of the sensor unit in the X-axis direction and an amplitude ratio with respect to the length of a protrusion.
Figure 18:
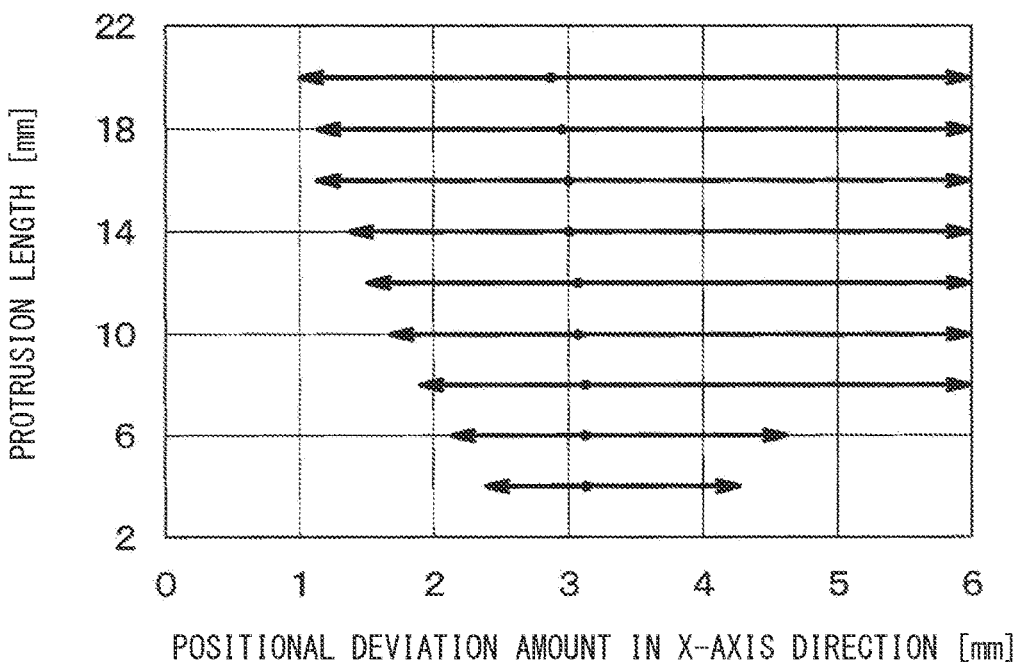
FIG. 18 is a diagram illustrating a relationship between the amount of positional deviation of the sensor unit in the X-axis direction and the length of the protrusion.

FIGS. 17 and 18 show the relationship between the amount of positional deviation of the sensor unit 40 in the X-axis direction and the amplitude ratio, when the narrow-portion length L1 is constant. FIGS. 17 and 18 show the results obtained when the width of the narrow portion 31a is 8 mm, the narrow-portion length L1 is 20 mm, and the gap length d is 0.1 mm. As shown in FIGS. 17 and 18, it is confirmed that the optimal range can be increased with the increase in length of the protrusion length L2, but the increase in the protrusion length L2 hardly affects the optimal position.

Figure 19:
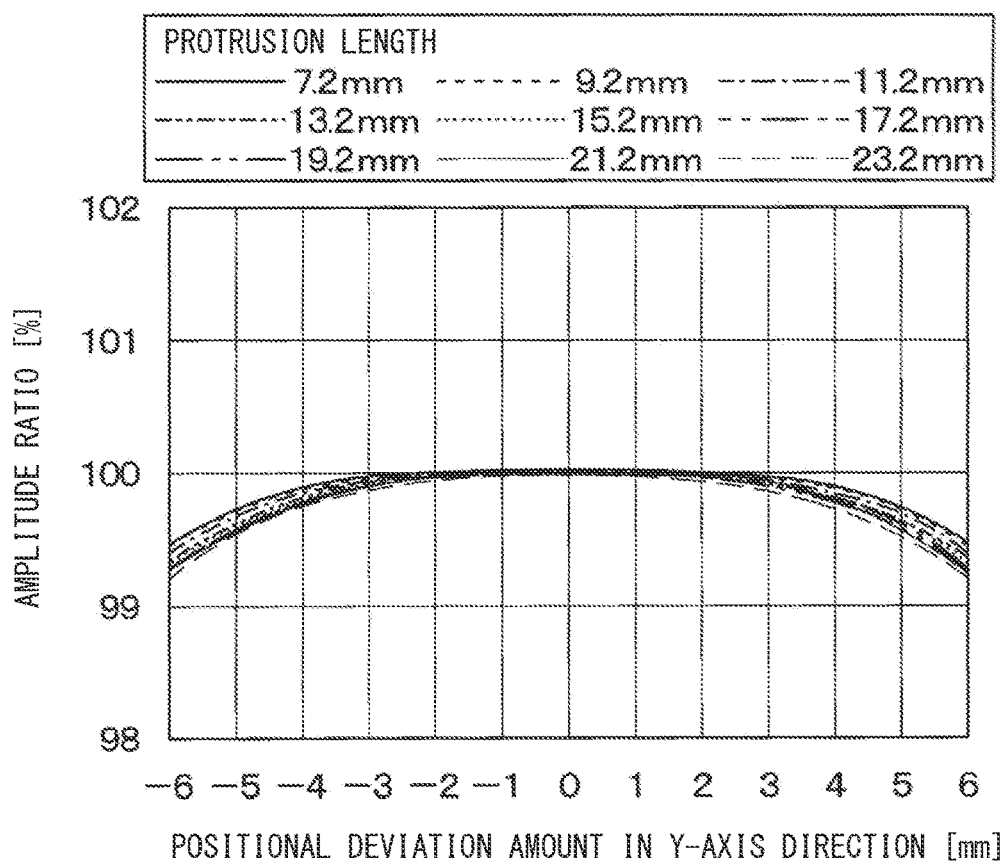
FIG. 19 is a diagram illustrating a relationship between the amount of positional deviation of the sensor unit in the Y-axis direction and an amplitude ratio with respect to the length of the protrusion.
Figure 20:
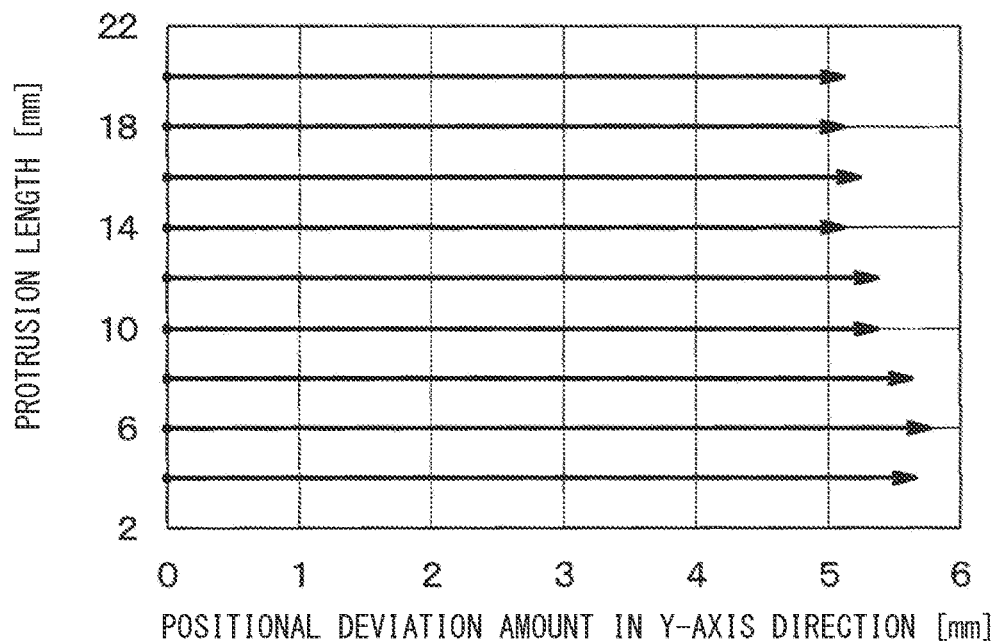
FIG. 20 is a diagram illustrating a relationship between the amount of positional deviation of the sensor unit in the Y-axis direction and the length of the protrusion.

FIGS. 19 and 20 shows the relationship between the amount of positional deviation of the sensor unit 40 in the Y-axis direction and the amplitude ratio when the narrow-portion length L1 is constant. FIGS. 19 and 20 show the results obtained when the width of the narrow portion 31a is 8 mm, the narrow-portion length L1 is 20 mm, and the gap length d is 0.1 mm. As shown in FIGS. 19 and 20, it is confirmed that the projection length L2 hardly affects the optimum position and hardly affects the optimum range.

Therefore, in the current sensor 1 as described above, since the cross-sectional area where the alternating current flows is reduced with the reduction of the width of the narrow portion 31a, the amount of heat generation is likely to increase. In this case, since the thermal stress generated in the sensor housing 10 is transferred to the wiring substrate 50 or the like, there is a possibility that the detection accuracy will be degraded. For this reason, in the current sensor 1, it is preferable that the width of the narrow portion 31a, the gap length d, the shape of the protrusion 311, and the like of the bus bar 30 be adjusted according to the conditions in use (for example, the maximum value of the alternating current), the conditions to be required, and the like.

Modification of Second Embodiment

Figure 21:
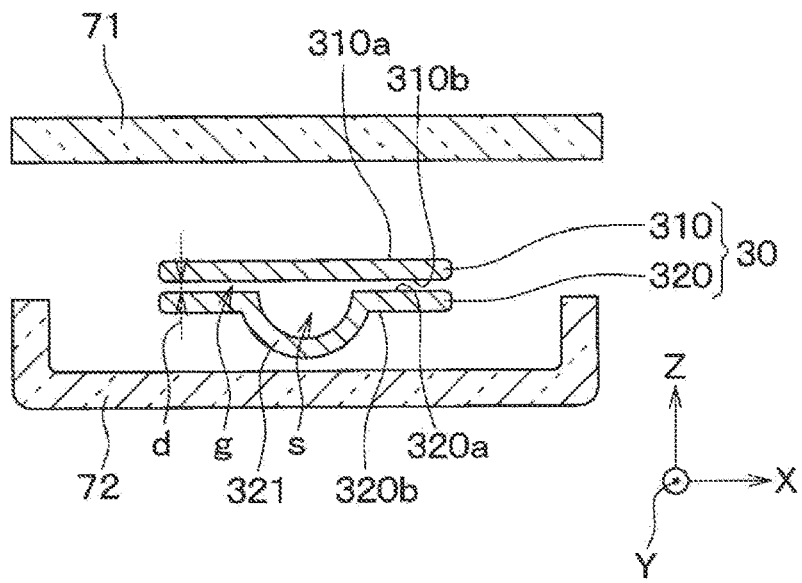
FIG. 21 is a diagram illustrating a cross-sectional view of a first current sensor according to a modification of the second embodiment.

The modification of the second embodiment will be described hereinafter. In the second embodiment described above, as shown in FIG. 21, the protrusion 311 may not be formed on the first bus bar 310. Instead, a protrusion 321 may formed on the second bus bar 320 to protrude on the other surface 320b side. FIG. 21 is a cross-sectional view corresponding to FIG. 3, and only the positional relationship among the bus bar 30, the first shield portion 71, and the second shield portion 72 is shown for easy understanding.

Figure 22:
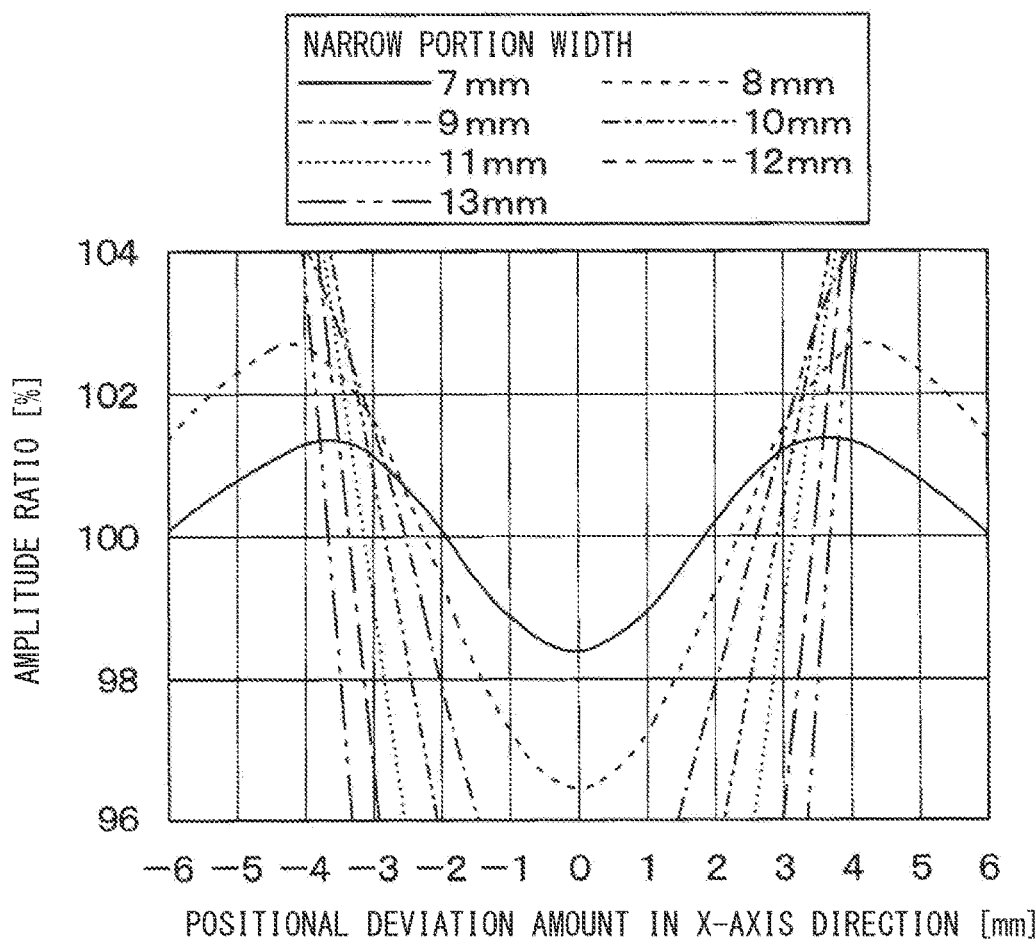
FIG. 22 is a diagram illustrating a relationship between the amount of positional deviation of a sensor unit in an X-axis direction and an amplitude ratio with respect to the width of the narrow portion.
Figure 23:
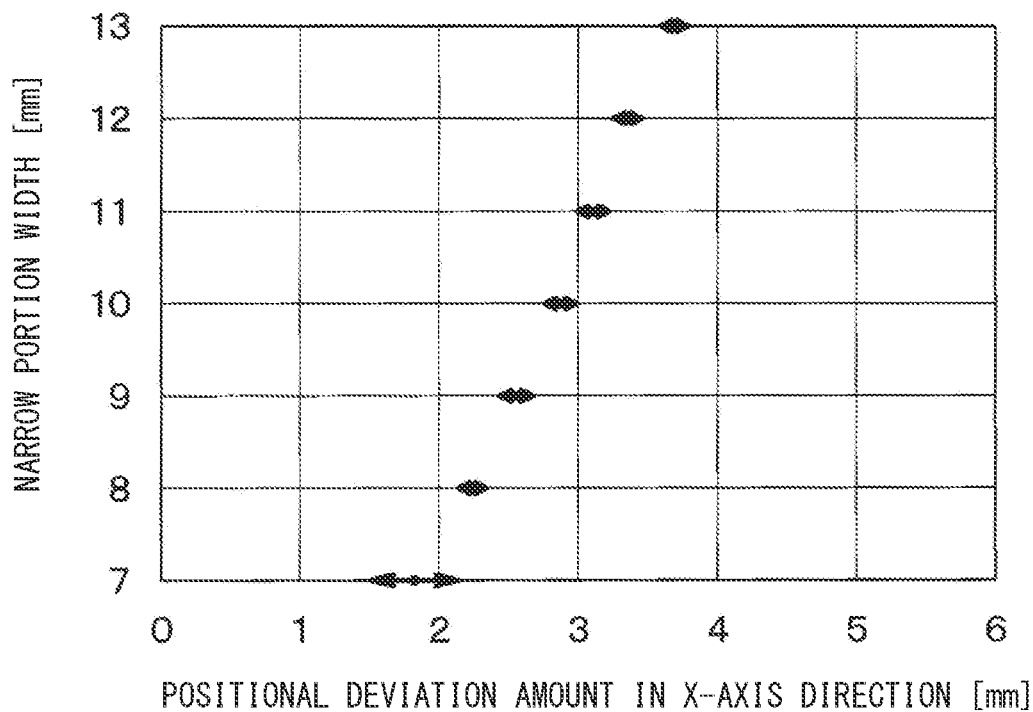
FIG. 23 is a diagram illustrating a relationship between the amount of positional deviation of the sensor unit in the X-axis direction and the width of the narrow portion.

In this case, as shown in FIGS. 22 and 23, it is confirmed that the optimum position more moves away from the reference in the X-axis direction as the width of the narrow portion 31a increases. Further, it is confirmed that the optimum range increases with the reduction in the width of the narrow portion 31a. FIGS. 22 and 23 show the results obtained when the gap length d is 0.1 mm. Further, when FIGS. 22 and 23 are compared with FIGS. 11 and 12 described in the second embodiment, it is confirmed that the optimum range can be larger in the case where the protrusion 311 is formed on the first bus bar 310 than that in the case where the protrusion 321 is formed on the second bus bar 320. For this reason, although the space S can be formed by forming the protrusion on the second bus bar 320, but it is preferable to form the protrusion on the first bus bar 310 because the optimum range can be increased.

In the second embodiment 2 described above, the shape of the protrusion 311 can be changed as appropriate. For example, the protrusion 311 may have any one of a triangular shape, a rectangular shape, a trapezoidal shape, and an arcuate shape in a plan view viewed in the X-axis direction, or may have another shape.

Third Embodiment

A third embodiment will be described. The present embodiment is different from the second embodiment in that protrusions are formed on the first bus bar 310 and the second bus bar 320. The other configurations of the present embodiment are similar to those of the second embodiment, and therefore a description of the similar configurations will be omitted.

Figure 24:
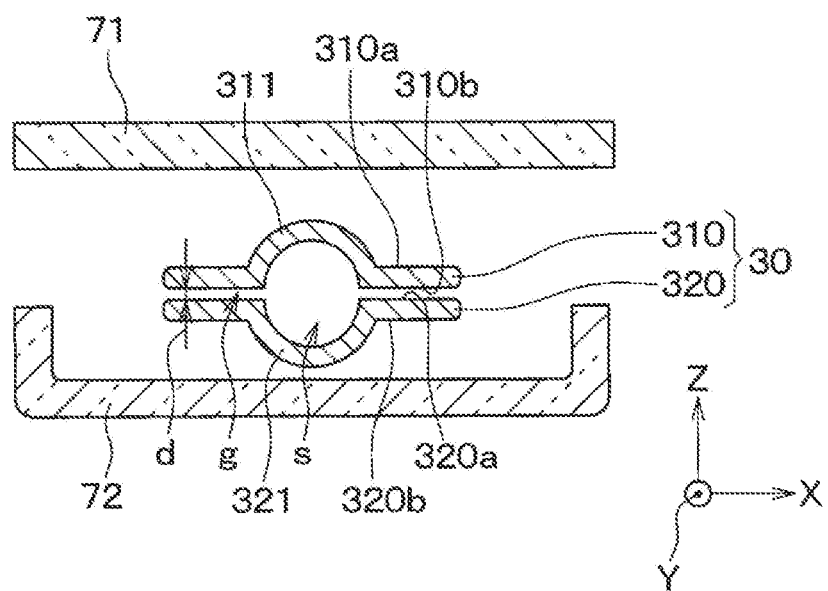
FIG. 24 is a diagram illustrating a cross-sectional view of a first current sensor according to a third embodiment.

In the current sensor 1 of the present embodiment, as shown in FIG. 24, the first bus bar 310 is formed with the protrusion 311, and the second bus bar 320 is formed with the protrusion 321. FIG. 24 is a cross-sectional view corresponding to FIG. 3, and only the positional relationship among the bus bar 30, the first shield portion 71, and the second shield portion 72 is shown for easy understanding.

Specifically, the second bus bar 320 is formed with the protrusion 321 protruding on the side opposite to the first bus bar 310, at the position facing the protrusion 311 of the first bus bar 310. In the present embodiment, the protrusion 311 formed on the first bus bar 310 and the protrusion 311 formed on the second bus bar 320 have the same shape.

According to the present embodiment described above, since the bus bar 30 is configured by stacking the first bus bar 310 and the second bus bar 320 such that the gap g is defined therebetween, it is possible to obtain the similar effects to those of the first embodiment described above.

(1) In the present embodiment, since the protrusion 311 is formed on the first bus bar 310 and the protrusion 321 is formed on the second bus bar 320, the space S can be increased, and thus the robustness with respect to the positional deviation of the sensor unit 40 in the X-axis direction can be further improved.

Figure 25:
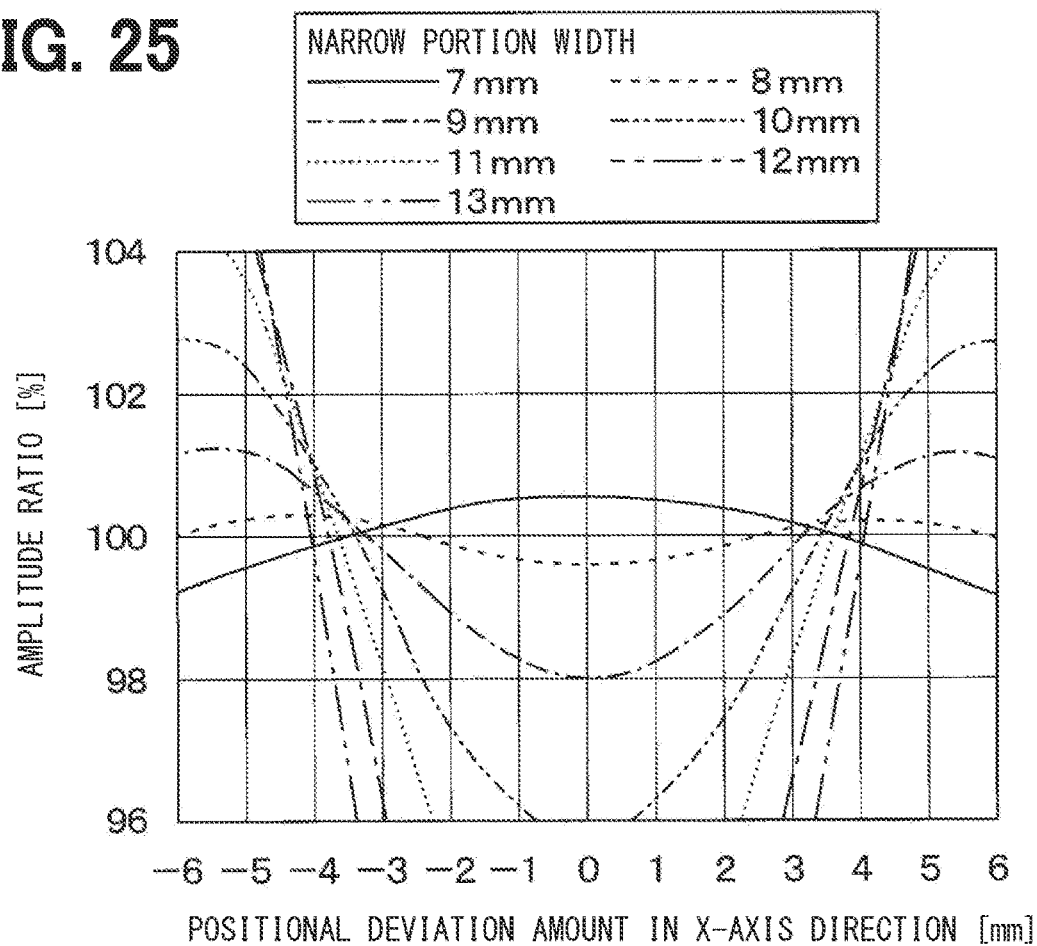
FIG. 25 is a diagram illustrating a relationship between the amount of positional deviation of a sensor unit in an X-axis direction and an amplitude ratio with respect to the width of a narrow portion.
Figure 26:
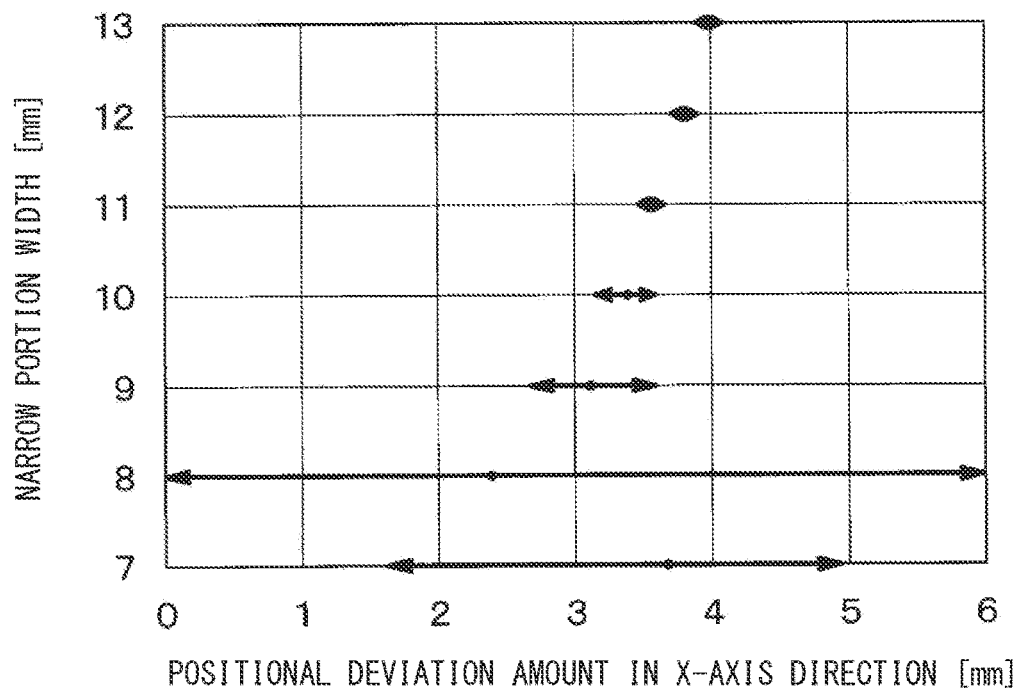
FIG. 26 is a diagram illustrating a relationship between the amount of positional deviation of the sensor unit in the X-axis direction and the width of the narrow portion.

Specifically, the current sensor 1 of the present embodiment has the relationship between the amount of positional deviation of the sensor unit 40 in the X-axis direction and the amplitude ratio as shown in FIGS. 25 and 26. FIGS. 25 and 26 show the results obtained when the gap length d is 0.1 mm.

As shown in FIGS. 25 and 26, when the width of the narrow portion 31a is 8 mm or more, it is confirmed that the optimum range can be widened, as compared with FIGS. 11 and 12 described in the second embodiment. Therefore, in the current sensor 1 of the present embodiment, it is possible to further improve the robustness with respect to the positional deviation of the sensor unit 40 in the X-axis direction.

Fourth Embodiment

A fourth embodiment will be described. The present embodiment is different from the second embodiment in that the first bus bar 310 and the second bus bar 320 are provided with a stepped portion. The other configurations of the present embodiment are similar to those of the second embodiment, and therefore a description of the similar configurations will be omitted.

Figure 27:
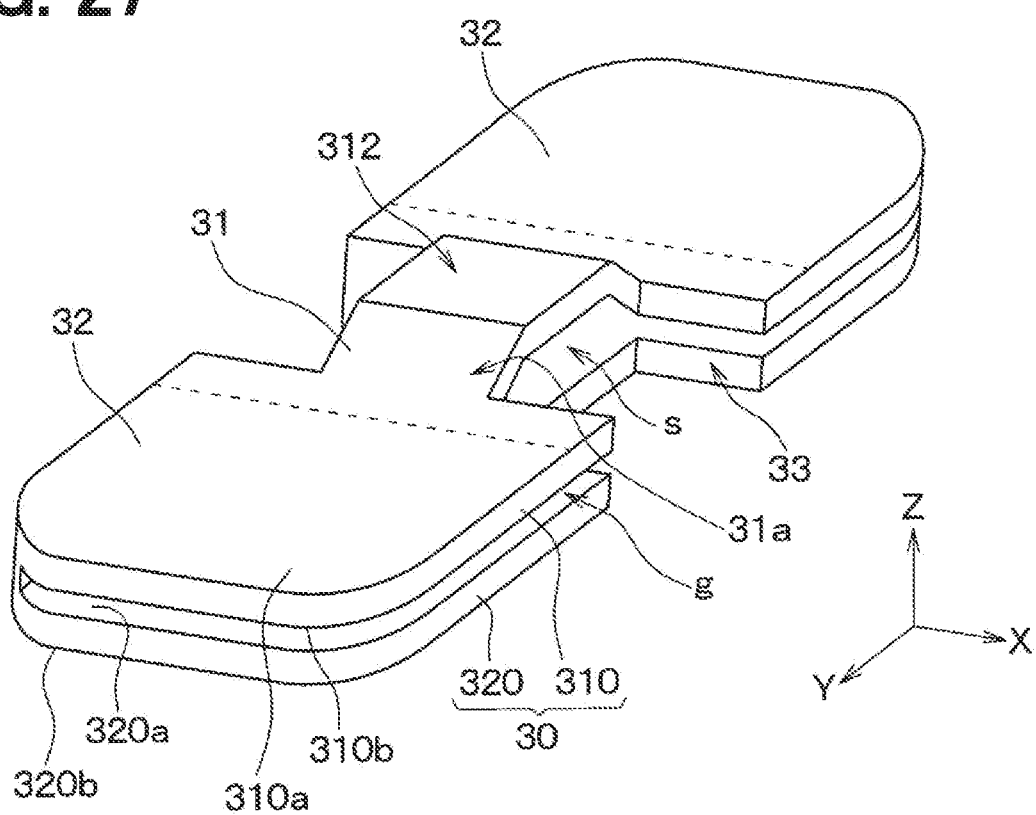
FIG. 27 is a diagram illustrating a perspective view of a bus bar according to a fourth embodiment.

In the bus bar 30 of the present embodiment, as shown in FIG. 27, the narrow portion 31a is entirely bent in the first bus bar 310 to form the stepped portion 312, thereby to provide the space S between the first bus bar 310 and the second bus bar 320.

According to the present embodiment described above, since the bus bar 30 is configured by stacking the first bus bar 310 and the second bus bar 320 such that the gap g is provided therebetween, it is possible to obtain the similar effects to those of the first embodiment.

(1) In the present embodiment, the first bus bar 310 is provided with the stepped portion 312. Therefore, the space S is provided between the first bus bar 310 and the second bus bar 320. As such, similarly to the second embodiment, it is possible to further improve the robustness with respect to the positional deviation of the sensor unit 40 in the X-axis direction.

Modification of Fourth Embodiment

A modification of the fourth embodiment will be described. In the fourth embodiment described above, the first bus bar 310 may not be formed with the stepped portion 312. Instead, the second bus bar 320 may be formed with the stepped portion on the other surface 320b side. Alternatively, the first bus bar 310 may be formed with the stepped portion 312, as well as the second bus bar 320 may be formed with the stepped portion.

Other Embodiments

Although the present disclosure has been described in accordance with the embodiments, it is understood that the present disclosure is not limited to such embodiments or structures. The present disclosure encompasses various modifications and variations within the scope of equivalents. Further, various combination and formation, and other combination and formation including one, more than one or less than one element may be made in the present disclosure.

For example, in each of the embodiments described above, instead of the wall portion 72b formed in the second shield portion 72, the first shield portion 71 may be provided with wall portions extending toward the second shield portion 72 at both end portions in the X-axis direction. In each of the embodiments described above, each of the first shield portion 71 and the second shield portion 72 may be formed with the wall portion. Furthermore, each of the first shield portion 71 and the second shield portion 72 may be provided by a single flat plate.

In each of the embodiments described above, in the bus bar 30, the covered portion 31 may not be formed with the narrow portion 31a, and the covered portion 31 may have the same width as the width of the fastening portion 32.

In each of the embodiments described above, the first bus bar 310 and the second bus bar 320 may be configured by stacking separate copper plates. In the case where the first bus bar 310 and the second bus bar 320 are made of separate copper plates, two different copper plates may be used, or one copper plate may be bent and then separated. In the case where the first bus bar 310 and the second bus bar 320 are made of two different copper plates, it is not necessary to perform a bending process or the like, and thus it is possible to simplify the manufacturing process.

In each of the embodiments described above, the current sensor 1 may be configured to include only one first current sensor 1a.

The embodiments described above may be combined. For example, the fourth embodiment may be combined with the second and third embodiments, so that the first bus bar 310 has the stepped portion 312. In this case, the protrusion 311 of the first bus bar 310 is formed in the stepped portion 312.

What is claimed is:

1. A current sensor for detecting an alternating current flowing through a bus bar, the current sensor comprising:
    the bus bar defining a longitudinal direction in one direction, and allowing the alternating current to flow in the longitudinal direction;
    a sensor unit configured to output a detection signal based on a magnetic field generated according to the alternating current flowing through the bus bar; and
    a sensor housing in which the bus bar and the sensor unit are arranged, wherein
    the bus bar is configured by a first bus bar and a second bus bar that are stacked in an arrangement direction of the bus bar and the sensor unit, the bus bar includes a covered portion covered with the sensor housing, and a fastening portion exposed from the sensor housing,
    in the covered portion, a flow direction of the alternating current in the first bus bar and a flow direction of the alternating current in the second bus bar are the same,
    the first bus bar and the second bus bar are arranged in a state in which a gap is provided between the first bus bar and the second bus bar in the covered portion, and
    the sensor unit and the second bus bar are arranged in the arrangement direction at opposite sides of the first bus bar.

2. The current sensor according to claim 1, wherein
    the bus bar includes a narrow portion having a width smaller than that of the fastening portion in the covered portion, the width being a length in a width direction intersecting the longitudinal direction and the arrangement direction, and
    the sensor unit is disposed above the narrow portion.

3. The current sensor according to claim 1, wherein
    the first bus bar and the second bus bar connect to each other in the fastening portion.

4. The current sensor according to claim 1, wherein
    the first bus bar and the second bus bar are provided by separate flat plates.

5. The current sensor according to claim 1, wherein the first bus bar and the second bus bar are in contact with each other at portions facing each other in the fastening portion.

6. The current sensor according to claim 1, wherein at least one of the first bus bar and the second bus bar is formed with a protrusion protruding on an opposite side to the other in the covered portion.

7. The current sensor according to claim 6, wherein the first bus bar faces the sensor unit, and at least the first bus bar has the protrusion.

8. The current sensor according to claim 1, wherein at least one of the first bus bar and the second bus bar has a stepped portion bent toward a side opposite to the other in the covered portion.

9. The current sensor according to claim 8, wherein the first bus bar faces the sensor unit, and at least the first bus bar has the stepped portion.

10. The current sensor according to claim 1, wherein the sensor unit is spaced apart in the arrangement direction from and faces a one surface of the first bus bar, the one surface of the first bus bar is opposite to an other surface of the first bus bar that faces a one surface of the second bus bar in the arrangement direction.

11. The current sensor according to claim 1, wherein the covered portion of the bus bar is disposed in a base portion of the sensor housing so that a part of the base portion is located in the gap, and the sensor unit is mounted on a wiring substrate that is arranged in an accommodation recess of the sensor housing defined on one side of the base portion, so that the sensor unit is on a surface of the wiring substrate that faces the first bus bar in the arrangement direction.

12. The current sensor according to claim 11, further comprising a lid disposed to cover the accommodation recess, the lid being snap-fitted to the sensor housing.

13. The current sensor according to claim 1, further comprising
a first shield portion and a second shield portion each made of a material having a magnetic permeability higher than a magnetic permeability of the sensor housing,
the first shield portion and the second shield portion are disposed in the sensor housing such that the bus bar is located in the arrangement direction between the first shield portion and the sensor shield portion, the first shield portion and the second shield portion each have a length in a width direction larger than a width of the bus bar in the width direction.

* * * * *